(12) United States Patent
Jeon et al.

(10) Patent No.: US 11,784,663 B2
(45) Date of Patent: Oct. 10, 2023

(54) METHOD AND APPARATUS FOR PERFORMING ENCODING ON BASIS OF PARITY CHECK MATRIX OF LOW DENSITY PARITY CHECK CODE GENERATED FROM PROTOGRAPH IN WIRELESS COMMUNICATION SYSTEM

(71) Applicant: LG Electronics Inc., Seoul (KR)

(72) Inventors: Kijun Jeon, Seoul (KR); Sangrim Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 17/627,434

(22) PCT Filed: Jul. 16, 2019

(86) PCT No.: PCT/KR2019/008749
§ 371 (c)(1),
(2) Date: Jan. 14, 2022

(87) PCT Pub. No.: WO2021/010512
PCT Pub. Date: Jan. 21, 2021

(65) Prior Publication Data
US 2022/0271776 A1    Aug. 25, 2022

(51) Int. Cl.
*H03M 13/00*   (2006.01)
*H03M 13/11*   (2006.01)
*H03M 13/27*   (2006.01)

(52) U.S. Cl.
CPC .... *H03M 13/1168* (2013.01); *H03M 13/1185* (2013.01); *H03M 13/2778* (2013.01); *H03M 13/6544* (2013.01)

(58) Field of Classification Search
CPC ......... H03M 13/1185; H03M 13/1102; H03M 13/1174; H03M 13/1168; H03M 13/27;
(Continued)

(56) References Cited

U.S. PATENT DOCUMENTS 8,359,522 B2 * 1/2013 Gunnam ............. H03M 13/616
                                                                714/801
8,397,125 B2 * 3/2013 Garani ............... H03M 13/1142
                                                                714/801
(Continued)

FOREIGN PATENT DOCUMENTS

KR    101991447    6/2019
WO    WO2018093286    5/2018
(Continued)

OTHER PUBLICATIONS

International Search Report in International Appln. No. PCT/KR2019/008749, dated Apr. 13, 2020, 5 pages (with English translation).

*Primary Examiner* — Esaw T Abraham
(74) *Attorney, Agent, or Firm* — Fish & Richardson P.C.

(57) ABSTRACT

A method for performing low density parity check (LDPC) coding of a transmitter in a wireless communication system, according to the present disclosure, may comprise the steps of: acquiring a proto-matrix corresponding to a protograph; on the basis of weights and lifting factors of columns of the proto-matrix, acquiring one or more permuted vectors corresponding to each of the columns, a first permuted vector included in the one or more permuted vectors having been randomly generated; distributing the one or more permuted vectors for each row of a corresponding column; on the basis of the distributed one or more permuted vectors, acquiring a plurality of lifted sub matrices corresponding to a plurality of elements of the proto-matrix; generating a base graph on the basis of the plurality of lifted sub matrices; generating a parity check matrix (PCM) on the basis of the base graph; and performing LDPC coding by using the PCM.

19 Claims, 14 Drawing Sheets

(58) Field of Classification Search
CPC ......... H03M 13/2778; H03M 13/6544; H03M 13/1154
See application file for complete search history.

(56) References Cited

U.S. PATENT DOCUMENTS

| | | | |
|---|---|---|---|
| 8,495,450 B2 * | 7/2013 | Abu-Surra | H04L 1/0057 |
| | | | 714/752 |
| 8,560,911 B2 * | 10/2013 | Abu-Surra | H03M 13/6525 |
| | | | 714/752 |
| 10,218,384 B2 * | 2/2019 | Sharon | G06F 3/064 |
| 10,565,040 B2 * | 2/2020 | Ryabinin | G06F 1/32 |
| 10,621,035 B2 * | 4/2020 | Motwani | G06F 11/1048 |
| 2009/0049363 A1 * | 2/2009 | Hocevar | H03M 13/1185 |
| | | | 714/E11.032 |
| 2009/0100311 A1 * | 4/2009 | Song | H03M 13/1111 |
| | | | 714/752 |
| 2017/0359086 A1 | 12/2017 | Kudekar et al. | |

FOREIGN PATENT DOCUMENTS

| | | |
|---|---|---|
| WO | WO2019001090 | 1/2019 |
| WO | WO2019001159 | 1/2019 |

* cited by examiner

FIG. 6A $$H_p = \begin{pmatrix} 3 & 2 & 0 \\ 2 & 1 & 2 \end{pmatrix}$$

FIG. 6B $$H_a = \begin{pmatrix} \begin{array}{ccc|ccc|ccc} 1 & 1 & 1 & 1 & 0 & 1 & 0 & 0 & 0 \\ 1 & 1 & 1 & 1 & 1 & 0 & 0 & 0 & 0 \\ 1 & 1 & 1 & 0 & 1 & 1 & 0 & 0 & 0 \\ \hline 0 & 1 & 1 & 1 & 0 & 0 & 1 & 0 & 1 \\ 1 & 0 & 1 & 0 & 1 & 0 & 0 & 1 & 1 \\ 1 & 1 & 0 & 0 & 0 & 1 & 1 & 1 & 0 \end{array} \end{pmatrix}$$

with column group labels 3, 2, 0 (top) and row group labels 2, 1, 2 (bottom)

FIG. 6C $$H = (S_{i,j})$$

$$= \begin{pmatrix} \begin{array}{ccc|ccc|ccc} S_{1,1} & S_{1,2} & S_{1,3} & S_{1,4} & -1 & S_{1,6} & -1 & -1 & -1 \\ S_{2,1} & S_{2,2} & S_{2,3} & S_{2,4} & S_{2,5} & -1 & -1 & -1 & -1 \\ S_{3,1} & S_{3,2} & S_{3,3} & -1 & S_{3,5} & S_{3,6} & -1 & -1 & -1 \\ \hline -1 & S_{4,2} & S_{4,3} & S_{4,4} & -1 & -1 & S_{4,7} & -1 & S_{4,9} \\ S_{5,1} & -1 & S_{5,3} & -1 & S_{5,5} & -1 & -1 & S_{5,8} & S_{5,9} \\ S_{6,1} & S_{6,2} & -1 & -1 & -1 & S_{6,6} & S_{6,7} & S_{6,8} & -1 \end{array} \end{pmatrix}$$

with column group labels 3, 2, 0 (top) and 2, 1, 2 (bottom)

| 1 | 1 | 1 | 1 |   |   |   | 1 | 1 |   |   |   |
|---|---|---|---|---|---|---|---|---|---|---|---|
| 1 | 1 | 1 | 1 |   |   | 1 |   |   | 1 |   |   |
| 1 | 1 | 1 | 1 |   | 1 |   |   |   |   | 1 |   |
| 1 | 1 | 1 | 1 | 1 |   |   |   |   |   |   | 1 |
|   | 1 |   | 1 |   | 1 |   |   |   |   |   | 1 |
| 1 |   | 1 |   |   |   |   | 1 |   | 1 |   |   |
| 1 |   | 1 |   | 1 |   |   |   |   |   | 1 |   |
|   | 1 |   | 1 |   |   | 1 |   | 1 |   |   |   |

METHOD AND APPARATUS FOR PERFORMING ENCODING ON BASIS OF PARITY CHECK MATRIX OF LOW DENSITY PARITY CHECK CODE GENERATED FROM PROTOGRAPH IN WIRELESS COMMUNICATION SYSTEM

CROSS-REFERENCE TO RELATED APPLICATIONS

This application is a National Stage application under 35 U.S.C. § 371 of International Application No. PCT/KR2019/008749, filed on Jul. 16, 2019, the disclosure of which is incorporated by reference in its entirety.

TECHNICAL FIELD

The present disclosure relates to a wireless communication system, and more particularly, to a method and apparatus for performing encoding based on a parity check matrix of low density parity check codes generated from a protograph in a wireless communication system.

BACKGROUND ART

Low density parity check (LPDC) codes and iterative decoding algorithms were introduced in 1962 by Gallager, and were rediscovered in 1996 by MacKay and Neal.

In information theory, LDPC codes are linear error correction codes, are used in a noise transmission channel, and are also referred to as linear block codes. Based on a bipartite graph, LDPC codes may be designed. The LDPC codes may be referred to as capacity access codes because they may provide performance close to the Shannon limit using iterative soft-decision algorithms. In legacy 3GPP-based communication systems (e.g., LTE, LTE-A, LTE-A pro, etc.), capacity access codes called turbo codes are used. It is well known in the art that the LDPC code has a bit error rate (BER) that is close to the Shannon limit in a binary additive white Gaussian noisy (AWGN) channel. By using the LDPC coding method, a low error rate having a relatively low complexity may be achieved.

In 3GPP TS 38.212, which is a fifth generation (5G)/new radio (NR) technology standard, LDPC coding has been adopted as channel coding in a transport channel (TrCH) such as an uplink shared channel (UL-SCH), a downlink shared channel (DL-SCH), and a paging channel (PCH). In addition, the LDPC coding may be used in ultra-reliable and low-latency communication (URLLC), which is one of the 5G use cases. The LDPC coding is being actively studied for efficient channel coding.

In recent wireless communication systems, strict latency and reliability requirements have been proposed. In particular, URLLC, which is one of the usage scenarios of 5G wireless communication systems, has been attracting attention. In the URLLC usage scenario, a new LDPC encoding parity check matrix has been proposed to reduce the decoding delay time for ultra-reliable and low-latency communication.

DISCLOSURE

Technical Problem

An object of the present disclosure is to provide an efficient (low density parity check) LDPC coding method in a wireless communication system.

Another object of the present disclosure is to provide a method of lifting a base graph from a protograph of LDPC codes for super ultra-reliable and low-latency communications (URLLC) may be provided.

A further object of the present disclosure is to provide a method and apparatus for performing encoding based on a parity check matrix of LDPC codes.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

In an aspect of the present disclosure, a method of performing low density parity check (LDPC) coding by a transmitter in a wireless communication system is provided. The method may include: obtaining a protomatrix related to a protograph; obtaining one or more permuted vectors related to each column of the protomatrix based on weights and lifting factors of columns of the protomatrix, wherein a first permuted vector included in the one or more permuted vectors is randomly generated; distributing the one or more permuted vectors for each row of a corresponding column; obtaining a plurality of lifted submatrices related to a plurality of elements of the protomatrix based on the distributed one or more permuted vectors; generating a base graph based on the plurality of lifted submatrices; generating a parity check matrix (PCM) based on the base graph; and performing the LDPC coding based on the PCM.

When a number of the one or more permuted vectors is more than or equal to 2, the remaining permuted vectors except for the first permuted vector may be obtained from the first permuted vector, and each of the one or more permuted vectors may have a different element at the same position.

The weights of the columns of the protomatrix may be determined based on edges of the protograph corresponding to the protomatrix.

The weights of the columns of the protomatrix may be equally distributed to rows of each column of the protomatrix.

Based on the edges of the protograph, each of the weights of the columns of the protomatrix may be distributed differently to rows of a corresponding column.

The rows of the corresponding column may be divided into at least one layer, and each of the weights of the columns of the protomatrix may be distributed differently to the rows of the corresponding column to minimize a number of the at least one layer.

The method of performing the LDPC coding by the transmitter in the wireless communication system according to the present disclosure may further include: generating a plurality of PCMs based on randomly generated first permuted vectors; selecting one PCM from among the plurality of PCMs based on LDPC coding performance of the plurality of PCMs; and performing the LDPC coding based on the selected one PCM.

In another aspect of the present disclosure, a transmitter configured to perform LDPC coding in a wireless communication system is provided. The transmitter may include: a memory connected to a processor; and the processor. The processor may be configured to: obtain one or more permuted vectors related to each column of a protomatrix based on weights and lifting factors of columns of the protomatrix, wherein a first permuted vector included in the one or more permuted vectors is randomly generated; distribute the one or more permuted vectors for each row of a corresponding column; obtain a plurality of lifted submatrices related to a plurality of elements of the protomatrix based on the distributed one or more permuted vectors; generate a base graph based on the plurality of lifted submatrices; generate a PCM based on the base graph; and perform the LDPC coding based on the PCM.

Advantageous Effects

According to the present disclosure, when layered decoding is performed, a base graph of extended LDPC encoding may maximize the parallelism of the layered decoding by lifting a base graph of LDPC codes, thereby reducing a decoding delay time and a decoding processing period.

It will be appreciated by persons skilled in the art that the effects that may be achieved with the present disclosure are not limited to what has been particularly described hereinabove and other advantages of the present disclosure will be more clearly understood from the following detailed description taken in conjunction with the accompanying drawings.

DESCRIPTION OF DRAWINGS

The accompanying drawings, which are included to provide a further understanding of the disclosure and are incorporated in and constitute a part of this specification, illustrate embodiments of the disclosure.

FIG. 6 is a diagram for explaining a method of generating a parity check matrix according to the present disclosure.

BEST MODE

Figure 1:
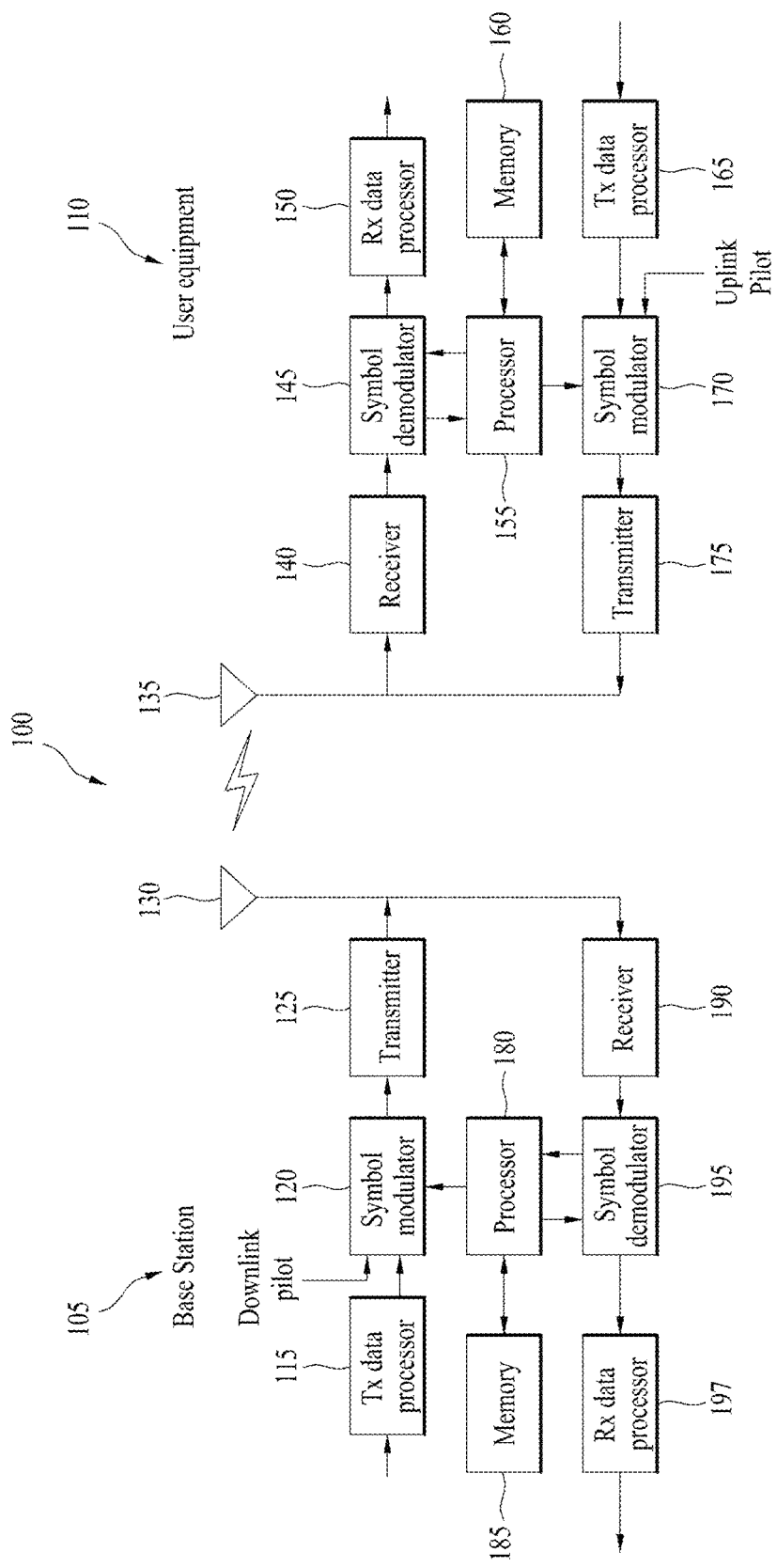
FIG. 1 is a block diagram showing configurations of a base station 105 and a user equipment 110 in a wireless communication system 100.

Hereinafter, preferred embodiments according to the present disclosure will be described in detail with reference to the accompanying drawings. The detailed description to be set forth below in conjunction with the accompanying drawings is intended to describe exemplary embodiments of the present disclosure, rather than to represent the only embodiments for implementing the present disclosure In the following detailed description of the disclosure includes details to help the full understanding of the present disclosure. Yet, it is apparent to those skilled in the art that the present disclosure may be implemented without these details. For instance, although the following descriptions are made in detail on the assumption that a mobile communication system includes 3GPP LTE system and 3GPP LTE-A, the following descriptions are applicable to other random mobile communication systems in a manner of excluding unique features of the 3GPP LTE and 3GPP LTE-A.

Occasionally, to prevent the present disclosure from getting vaguer, structures and/or devices known to the public are skipped or may be represented as block diagrams centering on the core functions of the structures and/or devices. Wherever possible, the same reference numbers will be used throughout the drawings to refer to the same or like parts. The embodiments of the present disclosure may be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc. UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE.

Moreover, in the following description, specific terminologies are provided to help the understanding of the present disclosure. And, the use of the specific terminology may be modified into another form within the scope of the technical idea of the present disclosure.

Although the present disclosure is described mainly based on 3GPP LTE/LTE-A/LTE-A pro or 5G/NR for clarity of explanation, the technical spirit of the present disclosure is not limited thereto. In addition, specific terms used in the following description are provided to help the understanding of the present disclosure, and the use of these specific terms may be modified to other forms without departing from the spirit of the present disclosure.

In the NR system, low density parity check (LDPC) coding is applied to uplink data transmitted/received on a physical uplink control channel (PUSCH) and downlink data transmitted/received on a PDSCH. Polar codes are applied to downlink control information (DCI). For uplink control information (UCI), Reed-Muller coding is applied to UCI with a small number of bits, and polar coding is applied to UCI with a large number of bits (see 3GPP TS 38.212).

In the NR system, a communication device uses LDPC codes to encode/decode uplink/downlink data. The NR system supports two LDPC base graphs (BGs) (i.e., two LDPC base matrices): LDPC BG1 optimized for small transport blocks and LDPC BG2 optimized for large transport blocks. In the NR system, LDPC BG1 is designed based on a mother code rate of 1/3, and LDPC BG2 is designed based on a mother code rate of 1/5. LDPC BG1 and LDPC BG2 used for encoding/decoding in the NR system are defined in 3GPP TS 38.212. The communication device selects LDPC BG1 or LDPC BG2 based on the size of a transport block and a coding rate R and uses the selected BG to encode/decode the transport block. The coding rate R is indicated by a modulation and coding scheme (MCS) index, $I_{MCS}$. The MCS index is dynamically provided to a user equipment (UE) over a PUSCH carrying the transport block or a physical downlink control channel (PDCCH) scheduling the PDSCH. Alternatively, the MCS index is provided to the UE over a PDCCH that activates or initializes a configured grant. Alternatively, the MCS index is provided to the UE through RRC signaling related to the configured grant.

According to the 5G/NR standard (TS 38.212), a channel coding process is divided into: cyclic redundancy check (CRC) attachment, code block segmentation and CRC attachment, channel coding, rate matching, and code block concatenation.

FIG. 1 is a block diagram showing configurations of a base station (BS) 105 and a UE 110 in a wireless communication system 100.

Although one BS 105 and one UE 110 (including a device-to-device (D2d) UE) are illustrated to simplify the wireless communication system 100, the wireless communication system 100 may include one or more BSs and/or one or more UEs.

Referring to FIG. 1, the BS 105 may include a transmission (Tx) data processor 115, a symbol modulator 120, a transmitter 125, a transmitting and receiving antenna 130, a processor 180, a memory 185, a receiver 190, a symbol demodulator 195, and a reception (Rx) data processor 197. The UE 110 may include a transmission (Tx) data processor 165, a symbol modulator 170, a transmitter 175, a transmitting and receiving antenna 135, a processor 155, a memory 160, a receiver 140, a symbol demodulator 155, and a reception (Rx) data processor 150. Although FIG. 1 shows that the BS 105 uses one transmitting and receiving antenna 130 and the UE 110 uses one transmitting and receiving antenna 135, each of the BS 105 and UE 110 may include a plurality of antennas. Therefore, each of the BS 105 and UE 110 according to the present disclosure may support the multi-input multi-output (MIMO) system. In addition, the BS 105 according to the present disclosure may also support both the single user-mimo (SU-MIMO) system and the multi-user-mimo (MU-MIMO) system.

The BS 105 may be a first device. The first device may include includes a BS, a network node, a transmitting UE, a receiving UE, a wireless device, a wireless communication device, a vehicle, a vehicle equipped with autonomous driving functions, a drone (unmanned aerial vehicle (UAV)), an artificial intelligence (AI) module, a robot, an augmented reality (AR) device, a virtual reality (VR) device, a machine type communication (MTC) device, an Internet of things (IoT) device, a medical device, a Fintech device (or financial devices), a security device, a climate/environmental device, a device related to the fourth industrial revolution field, or a device related to 5G services. For example, the drone may be a flying object controlled by radio control signals without a human pilot. For example, the MTC and IOT devices may be a device that does not require direct human intervention or manipulation. The MTC and IoT devices may include a smart meter, a vending machine, a thermometer, a smart bulb, a door lock, or various sensors. For example, the medical device may be a device used for diagnosing, treating, mitigating, handling, or preventing a disease or a device used for testing, substituting, or modifying a structure or function. The medical device may include a device for medical treatment, a device for operation, a device for (external) diagnosis, a hearing aid, or a device for surgery. For example, the security device may be a device installed to prevent a potential danger and maintain safety. The security device may include a camera, a CCTV, or a black box. For example, the Fintech device may be a device capable of providing financial services such as mobile payment. The Fintech device may include a payment device or point of sales (POS). For example, the climate/environment device may include a device for monitoring or predicting the climate/environment.

In addition, the UE may include a mobile phone, a smart phone, a laptop computer, a digital broadcast terminal, a personal digital assistant (PDA), a portable multimedia player (PMP), a navigation device, a slate personal computer (PC), a tablet PC, an ultrabook, a wearable device (e.g., a smartwatch, a smart glass, a head mounted display (HMD), etc.), a foldable device, etc. For example, the HMD may be a display device worn on the head of a user and be used to realize VR or AR.

For downlink transmission, the Tx data processor 115 receives traffic data, formats the received traffic data, codes the formated trafffice data, interleaves and modulates (or performs symbol mapping on) the coded traffic data, and provides modulated symbols (data symbols). The symbol modulator 120 provides a stream of symbols by receiving and processing the data symbols together with pilot symbols.

The symbol modulator 120 performs multiplexing of the data and pilot symbols and transmits the multiplexed symbols to the transmitter 125. In this case, each of the transmitted symbols may be a data symbol, a pilot symbol or a zero value signal. In each symbol period, pilot symbols may be continuously transmitted. In this case, each of the pilot symbols may be a frequency division multiplexing (FDM) symbol, an orthogonal frequency division multiplexing (OFDM) symbol, or a code division multiplexing (CDM) symbol.

The transmitter 125 receives the symbol stream, converts the received symbol stream into one or more analog signals, adjusts the analog signals (e.g., amplification, filtering, frequency upconverting, etc.), and generates a downlink signal suitable for transmission over a radio channel. Thereafter, the transmitting antenna 130 transmits the downlink signal to the UE.

Hereinafter, the configuration of the UE 110 will be described. The receiving antenna 135 receives the downlink signal from the BS and forwards the received signal to the receiver 140. The receiver 140 adjusts the received signal (e.g., filtering, amplification, frequency downconverting, etc.) and obtains samples by digitizing the adjusted signal. The symbol demodulator 145 demodulates the received pilot symbols and forwards the demodulated pilot symbols to the processor 155 for channel estimation.

The symbol demodulator 145 receives a frequency response estimate for downlink from the processor 155, performs data demodulation on the received data symbols, obtains data symbol estimates (i.e., estimates for the transmitted data symbols), and provides the data symbols estimates to the Rx data processor 150. The Rx data processor 150 reconstructs the transmitted traffic data by demodulating (i.e., performing symbol demapping on), deinterleaving and decoding the data symbol estimates.

The processing performed by the symbol demodulator 145 and the Rx data processor 150 is complementary to that performed by the symbol modulator 120 and the Tx data processor 115 of the BS 105.

For uplink transmission, the Tx data processor 165 of the UE 110 processes traffic data and provides data symbols. The symbol modulator 170 receives the data symbols, performs multiplexing of the received data symbols, modulates the multiplexed symbols, and provides a stream of symbols to the transmitter 175. The transmitter 175 receives the symbol stream, processes the received stream, and generates an uplink signal. The transmitting antenna 135 transmits the generated uplink signal to the BS 105. The transmitter and receiver of each of the UE and BS may be implemented as one radio frequency (RF) unit.

The BS 105 receives the uplink signal from the UE 110 through the receiving antenna 130. The receiver 190 obtains samples by processing the received uplink signal. Subsequently, the symbol demodulator 195 processes the samples and provides pilot symbols received in uplink and data symbol estimates. The Rx data processor 197 reconstructs the traffic data transmitted from the UE 110 by processing the data symbol estimates.

The processor 155 of the UE 110 controls operations (e.g., control, adjustment, management, etc.) of the UE 110, and the processor 180 of the BS 105 controls operations (e.g., control, adjustment, management, etc.) of the BS 105. The processors 155 and 180 may be connected to the memories 160 and 185 configured to store program codes and data, respectively. Specifically, the memories 160 and 185, which are connected to the processors 155 and 180, respectively, are configured to store operating systems, applications, and general files.

Each of the processors 155 and 180 may be called a controller, a microcontroller, a microprocessor, a microcomputer, or the like. In addition, the processors 155 and 180 may be implemented with hardware, firmware, software, and/or any combinations thereof. When embodiments of the present disclosure are implemented with hardware, the processors 155 and 180 may be provided with application specific integrated circuits (ASICs), digital signal processors (DSPs), digital signal processing devices (DSPDs), programmable logic devices (PLDs), field programmable gate arrays (FPGAs), etc.

When the embodiments of the present disclosure are implemented with firmware or software, the firmware or software may be configured to include modules, procedures, and/or functions for performing the above-described functions or operations of the present disclosure. In addition, the firmware or software configured to implement the present disclosure may be included in the processors 155 and 180. Alternatively, the firmware or software may be stored in the memories 160 and 185 and then driven by the processors 155 and 180.

Radio protocol layers between the UE and BS in the wireless communication system (network) may be classified as Layer 1 (L1), Layer 2 (L2), and Layer 3 (L3) based on the three lower layers of the open system interconnection (OSI) model well known in communication systems. A physical layer belongs to the L1 layer and provides an information transfer service over a physical channel. A radio resource control (RRC) layer belongs to the L3 layer and provides control radio resources between the UE and network. That is, the UE and BS may exchange RRC messages through RRC layers with the wireless communication network.

In the present specification, the processor 155 of the UE 110 and the processor 180 of the BS 105 are in charge of processing data and signals, except for the following functions: transmission, reception, and storage, they are not mentioned specifically for convenience of description. In other words, even if the processors 155 and 180 are not mentioned, a series of operations such as data processing operations except for the transmission, reception, and storage functions may be assumed to be performed by the processors 155 and 180.

Figure 2:
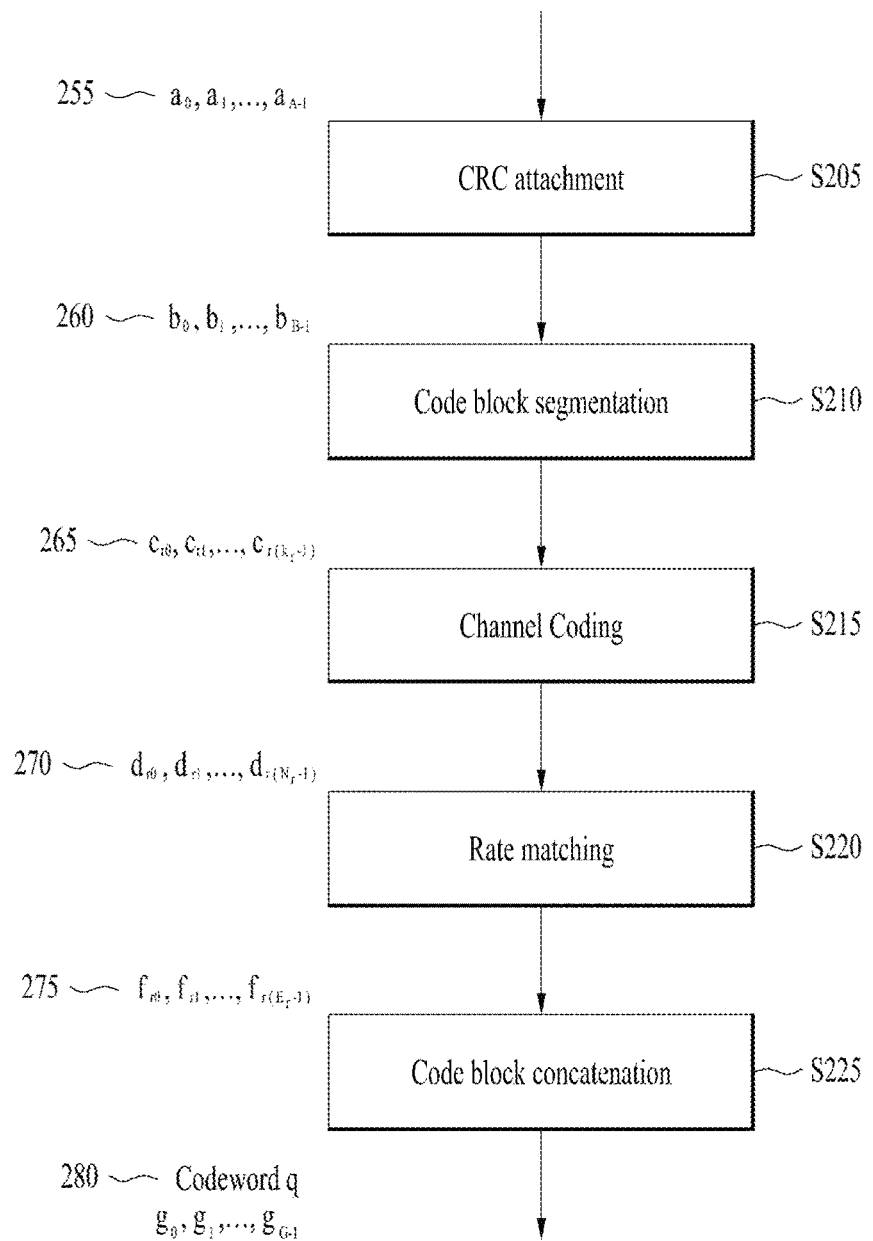
FIG. 2 is a diagram for explaining a channel coding method based on low density parity check (LDPC) codes according to the present disclosure.

FIG. 2 is a diagram for explaining a channel coding method based on LDPC codes according to the present disclosure.

Data subject to channel coding is referred to as a transport block. Typically, depending on the performance of channel coding, the transport block is divided into code blocks, each of which has a size less than or equal to a predetermined value. For example, in turbo coding of 3GPP TS 36.212, the code block may have a maximum size of 6144 bits. In low density parity check (LDPC) coding of 3GPP TS 38.212, the code block may have a maximum size of 8448 bits (in basegraph 1) or 3840 bits (in basegraph 2).

The channel coding method according to the present disclosure may include attaching a cyclic redundancy check (CRC) code to a transport block (S205); segmenting the transport block into code blocks (S210); encoding the segmented code blocks (S215); perform rate matching of the encoded code blocks (S220); and concatenating the rate-matched code blocks (S225).

In step S205, party bits with a length of L are attached to the transport block (255) ($a_0, \ldots, a_{A-1}$). The length L may be any one of 6, 11, 16, and 24. Typically, cyclic generator polynomials are used to generate party bits. In addition, scrambling operation may be applied to output bits (260) ($b_0, \ldots, b_{B-1}$), which depend on the CRC attachment, with a radio network temporary identifier (RNTI). Exclusive OR (EOR) operation may be applied between a scrambling sequence and corresponding bits based on the scrambling operation.

The output bits (260) ($b_0, \ldots, b_{B-1}$) depending on the CRC attachment may be segmented into code blocks (265) according to code block sizes. This is called code block segmentation. The code block sizes are determined by channel coding methods. A code block size suitable for each channel coding method may be determined theoretically or experimentally.

Based on LDPC channel coding, the segmented code blocks (265) ($c_{r0}, \ldots, c_{r(Kr-1)}$) are encoded into coded bits (270), ($d_{r0}, \ldots, d_{r(Nr-1)}$), respectively. The LDPC coding may be performed according to any one of random like coding and structured coding. In the LDPC coding, encoding may be performed based on a generator matrix in some cases. Alternatively, in the LDPC coding, encoding may be performed based on a base graph. In 3GPP TS 38.212, it is specified that encoding is performed based on a base graph according to quasi-cyclic LDPC coding.

Tables 1 and 2 described below show basegraph 1 (BG1) defined in 3GPP TS 38.212.

TABLE 1

| $H_{BG}$ | | | | | | | | | |
|---|---|---|---|---|---|---|---|---|---|
| Row index | Column index | $V_{i,j}$ Set index $i_{LS}$ | | | | | | | |
| i | j | 0 | 1 | 2 | 3 | 4 | 5 | 6 | 7 |
| 0 | 0 | 250 | 307 | 73 | 223 | 211 | 294 | 0 | 135 |
|   | 1 | 69 | 19 | 15 | 16 | 198 | 118 | 0 | 227 |
|   | 2 | 226 | 50 | 103 | 94 | 188 | 167 | 0 | 126 |
|   | 3 | 159 | 369 | 49 | 91 | 186 | 330 | 0 | 134 |
|   | 5 | 100 | 181 | 240 | 74 | 219 | 207 | 0 | 84 |
|   | 6 | 10 | 216 | 39 | 10 | 4 | 165 | 0 | 83 |
|   | 9 | 59 | 317 | 15 | 0 | 29 | 243 | 0 | 53 |
|   | 10 | 229 | 288 | 162 | 205 | 144 | 250 | 0 | 225 |

TABLE 1-continued

| Row index i | Column index j | \multicolumn{8}{c}{$V_{i,j}$ Set index $i_{LS}$} |
|---|---|---|---|---|---|---|---|---|---|
| | | 0 | 1 | 2 | 3 | 4 | 5 | 6 | 7 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 221 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |
| | 6 | 93 | 161 | 227 | 188 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 235 | 256 | 204 | 211 |
| | 26 | 0 | 0 | 0 | 0 | 0 | 0 | 0 | 0 |
| 5 | 0 | 205 | 195 | 83 | 164 | 261 | 219 | 185 | 2 |
| | 1 | 236 | 14 | 292 | 59 | 181 | 130 | 100 | 171 |
| | 3 | 194 | 115 | 50 | 86 | 72 | 251 | 24 | 47 |
| | 12 | 231 | 166 | 318 | 80 | 283 | 322 | 65 | 143 |
| 15 | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 48 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 168 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |

TABLE 1-continued

| H_BG | | | | | | | | | |
|---|---|---|---|---|---|---|---|---|---|
| Row index | Column index | $V_{i,j}$ Set index $i_{LS}$ | | | | | | | |
| i | j | 0 | 1 | 2 | 3 | 4 | 5 | 6 | 7 |
|  | 8 | 194 | 101 | 304 | 174 | 72 | 268 | 22 | 9 |
|  | 49 | 0 | 0 | 0 | 0 | 0 | 0 | 0 | 0 |
| 28 | 0 | 128 | 222 | 11 | 146 | 275 | 102 | 4 | 32 |
|  | 4 | 165 | 19 | 293 | 153 | 0 | 1 | 1 | 43 |
|  | 19 | 181 | 244 | 50 | 217 | 155 | 40 | 40 | 200 |
|  | 21 | 63 | 274 | 234 | 114 | 62 | 167 | 93 | 205 |
|  | 50 | 0 | 0 | 0 | 0 | 0 | 0 | 0 | 0 |
| 29 | 1 | 86 | 252 | 27 | 150 | 0 | 273 | 92 | 232 |
|  | 14 | 236 | 5 | 308 | 11 | 180 | 104 | 136 | 32 |
|  | 18 | 84 | 147 | 117 | 53 | 0 | 243 | 106 | 118 |
|  | 25 | 6 | 78 | 29 | 68 | 42 | 107 | 6 | 103 |
|  | 51 | 0 | 0 | 0 | 0 | 0 | 0 | 0 | 0 |
| 30 | 0 | 216 | 159 | 91 | 34 | 0 | 171 | 2 | 170 |

TABLE 2

| i | j | 0 | 1 | 2 | 3 | 4 | 5 | 6 | 7 |
|---|---|---|---|---|---|---|---|---|---|
| 5 | 16 | 28 | 241 | 201 | 182 | 254 | 295 | 207 | 210 |
|  | 21 | 123 | 51 | 267 | 130 | 79 | 258 | 161 | 180 |
|  | 22 | 115 | 157 | 279 | 153 | 144 | 283 | 72 | 180 |
|  | 27 | 0 | 0 | 0 | 0 | 0 | 0 | 0 | 0 |
| 6 | 0 | 183 | 278 | 289 | 158 | 80 | 294 | 6 | 199 |
|  | 6 | 22 | 257 | 21 | 119 | 144 | 73 | 27 | 22 |
|  | 10 | 28 | 1 | 293 | 113 | 169 | 330 | 163 | 23 |
|  | 11 | 67 | 351 | 13 | 21 | 90 | 99 | 50 | 100 |
|  | 13 | 244 | 92 | 232 | 63 | 59 | 172 | 48 | 92 |
|  | 17 | 11 | 253 | 302 | 51 | 177 | 150 | 24 | 207 |
|  | 18 | 157 | 18 | 138 | 136 | 151 | 284 | 38 | 52 |
|  | 20 | 211 | 225 | 235 | 116 | 108 | 305 | 91 | 13 |
|  | 28 | 0 | 0 | 0 | 0 | 0 | 0 | 0 | 0 |
| 7 | 0 | 220 | 9 | 12 | 17 | 169 | 3 | 145 | 77 |
|  | 1 | 44 | 62 | 88 | 76 | 189 | 103 | 88 | 146 |
|  | 4 | 159 | 316 | 207 | 104 | 154 | 224 | 112 | 209 |
|  | 7 | 31 | 333 | 50 | 100 | 184 | 297 | 153 | 32 |
|  | 8 | 167 | 290 | 25 | 150 | 104 | 215 | 159 | 166 |
|  | 14 | 104 | 114 | 76 | 158 | 164 | 39 | 76 | 18 |
|  | 29 | 0 | 0 | 0 | 0 | 0 | 0 | 0 | 0 |
| 8 | 0 | 112 | 307 | 295 | 33 | 54 | 348 | 172 | 181 |
|  | 1 | 4 | 179 | 133 | 95 | 0 | 75 | 2 | 105 |
|  | 3 | 7 | 165 | 130 | 4 | 252 | 22 | 131 | 141 |
|  | 12 | 211 | 18 | 231 | 217 | 41 | 312 | 141 | 223 |
|  | 16 | 102 | 39 | 296 | 204 | 98 | 224 | 96 | 177 |
|  | 19 | 164 | 224 | 110 | 39 | 46 | 17 | 99 | 145 |
|  | 21 | 109 | 368 | 269 | 58 | 15 | 59 | 101 | 199 |
|  | 22 | 241 | 67 | 245 | 44 | 230 | 314 | 35 | 153 |
|  | 24 | 90 | 170 | 154 | 201 | 54 | 244 | 116 | 38 |
|  | 30 | 0 | 0 | 0 | 0 | 0 | 0 | 0 | 0 |
| 9 | 0 | 103 | 366 | 189 | 9 | 162 | 156 | 6 | 169 |
|  | 1 | 182 | 232 | 244 | 37 | 159 | 88 | 10 | 12 |
|  | 10 | 109 | 321 | 36 | 213 | 93 | 293 | 145 | 206 |
|  | 11 | 21 | 133 | 286 | 105 | 134 | 111 | 53 | 221 |
|  | 13 | 142 | 57 | 151 | 89 | 45 | 92 | 201 | 17 |
|  | 17 | 14 | 303 | 267 | 185 | 132 | 152 | 4 | 212 |
|  | 18 | 61 | 63 | 135 | 109 | 76 | 23 | 164 | 92 |
|  | 20 | 216 | 82 | 209 | 218 | 209 | 337 | 173 | 205 |
|  | 31 | 0 | 0 | 0 | 0 | 0 | 0 | 0 | 0 |
| 10 | 1 | 98 | 101 | 14 | 82 | 178 | 175 | 126 | 116 |
|  | 2 | 149 | 339 | 80 | 165 | 1 | 253 | 57 | 151 |
|  | 4 | 167 | 274 | 211 | 174 | 28 | 27 | 156 | 70 |
|  | 7 | 160 | 111 | 75 | 19 | 267 | 231 | 16 | 230 |
|  | 8 | 49 | 383 | 161 | 194 | 234 | 49 | 12 | 115 |
|  | 14 | 58 | 354 | 311 | 103 | 201 | 267 | 70 | 134 |
|  | 32 | 0 | 0 | 0 | 0 | 0 | 0 | 0 | 1 |
| 11 | 0 | 77 | 48 | 16 | 52 | 55 | 25 | 184 | 152 |
|  | 1 | 41 | 102 | 147 | 11 | 23 | 322 | 194 | 115 |
|  | 12 | 83 | 8 | 290 | 2 | 274 | 200 | 123 | 134 |
|  | 16 | 182 | 47 | 289 | 35 | 181 | 351 | 16 | 1 |
|  | 21 | 78 | 188 | 177 | 32 | 273 | 166 | 104 | 152 |
|  | 22 | 252 | 334 | 43 | 84 | 39 | 338 | 109 | 165 |
|  | 23 | 22 | 115 | 280 | 201 | 26 | 192 | 124 | 107 |
|  | 33 | 0 | 0 | 0 | 0 | 0 | 0 | 0 | 0 |

TABLE 2-continued

| i | j | 0 | 1 | 2 | 3 | 4 | 5 | 6 | 7 |
|---|---|---|---|---|---|---|---|---|---|
| 12 | 0 | 160 | 77 | 229 | 142 | 225 | 123 | 6 | 186 |
|  | 1 | 42 | 186 | 235 | 175 | 162 | 217 | 20 | 215 |
|  | 10 | 21 | 174 | 169 | 136 | 244 | 142 | 203 | 124 |
|  | 11 | 32 | 232 | 48 | 3 | 151 | 110 | 153 | 180 |
|  | 13 | 234 | 50 | 105 | 28 | 238 | 176 | 104 | 98 |
|  | 18 | 7 | 74 | 52 | 182 | 243 | 76 | 207 | 80 |
|  | 34 | 0 | 0 | 0 | 0 | 0 | 0 | 0 | 0 |
| 13 | 0 | 177 | 313 | 39 | 81 | 231 | 311 | 52 | 220 |
|  | 3 | 248 | 177 | 302 | 56 | 0 | 251 | 147 | 185 |
|  | 7 | 151 | 266 | 303 | 72 | 216 | 265 | 1 | 154 |
|  | 20 | 185 | 115 | 160 | 217 | 47 | 94 | 16 | 178 |
|  | 23 | 62 | 370 | 37 | 78 | 36 | 81 | 46 | 150 |
|  | 35 | 0 | 0 | 0 | 0 | 0 | 0 | 0 | 0 |
| 14 | 0 | 206 | 142 | 78 | 14 | 0 | 22 | 1 | 124 |
|  | 12 | 55 | 248 | 299 | 175 | 186 | 322 | 202 | 144 |
|  | 15 | 206 | 137 | 54 | 211 | 253 | 277 | 118 | 182 |
|  | 16 | 127 | 89 | 61 | 191 | 16 | 156 | 130 | 95 |
|  | 17 | 16 | 347 | 179 | 51 | 0 | 66 | 1 | 72 |
|  | 21 | 229 | 12 | 258 | 43 | 79 | 78 | 2 | 76 |
|  | 38 | 0 | 0 | 0 | 0 | 0 | 0 | 0 | 0 |
| 15 | 0 | 40 | 241 | 229 | 90 | 170 | 176 | 173 | 39 |
| 30 | 10 | 73 | 229 | 23 | 130 | 90 | 16 | 88 | 199 |
|  | 13 | 120 | 260 | 105 | 210 | 252 | 95 | 112 | 26 |
|  | 24 | 9 | 90 | 135 | 123 | 173 | 212 | 20 | 105 |
|  | 52 | 0 | 0 | 0 | 0 | 0 | 0 | 0 | 0 |
| 31 | 1 | 95 | 100 | 222 | 175 | 144 | 101 | 4 | 73 |
|  | 7 | 177 | 215 | 308 | 49 | 144 | 297 | 49 | 149 |
|  | 22 | 172 | 258 | 66 | 177 | 166 | 279 | 125 | 175 |
|  | 25 | 61 | 256 | 162 | 128 | 19 | 222 | 194 | 108 |
|  | 53 | 0 | 0 | 0 | 0 | 0 | 0 | 0 | 0 |
| 32 | 0 | 221 | 102 | 210 | 192 | 0 | 351 | 6 | 103 |
|  | 12 | 112 | 201 | 22 | 209 | 211 | 265 | 126 | 110 |
|  | 14 | 199 | 175 | 271 | 58 | 36 | 338 | 63 | 151 |
|  | 24 | 121 | 287 | 217 | 30 | 162 | 83 | 20 | 211 |
|  | 54 | 0 | 0 | 0 | 0 | 0 | 0 | 0 | 0 |
| 33 | 1 | 2 | 323 | 170 | 114 | 0 | 56 | 10 | 199 |
|  | 2 | 187 | 8 | 20 | 49 | 0 | 304 | 30 | 132 |
|  | 11 | 41 | 361 | 140 | 161 | 76 | 141 | 6 | 172 |
|  | 21 | 211 | 105 | 33 | 137 | 18 | 101 | 92 | 65 |
|  | 55 | 0 | 0 | 0 | 0 | 0 | 0 | 0 | 0 |
| 34 | 0 | 127 | 230 | 187 | 82 | 197 | 60 | 4 | 161 |
|  | 7 | 167 | 148 | 296 | 186 | 0 | 320 | 153 | 237 |
|  | 15 | 164 | 202 | 5 | 68 | 108 | 112 | 197 | 142 |
|  | 17 | 159 | 312 | 44 | 150 | 0 | 54 | 155 | 180 |
|  | 56 | 0 | 0 | 0 | 0 | 0 | 0 | 0 | 0 |
| 35 | 1 | 161 | 320 | 207 | 192 | 199 | 100 | 4 | 231 |
|  | 6 | 197 | 335 | 158 | 173 | 278 | 210 | 45 | 174 |
|  | 12 | 207 | 2 | 55 | 26 | 0 | 195 | 168 | 145 |
|  | 22 | 103 | 266 | 285 | 187 | 205 | 268 | 185 | 100 |
|  | 57 | 0 | 0 | 0 | 0 | 0 | 0 | 0 | 0 |
| 36 | 0 | 37 | 210 | 259 | 222 | 216 | 135 | 6 | 11 |
|  | 14 | 105 | 313 | 179 | 157 | 16 | 15 | 200 | 207 |
|  | 15 | 51 | 297 | 178 | 0 | 0 | 35 | 177 | 42 |
|  | 18 | 120 | 21 | 160 | 6 | 0 | 188 | 43 | 100 |
|  | 58 | 0 | 0 | 0 | 0 | 0 | 0 | 0 | 0 |
| 37 | 1 | 198 | 269 | 298 | 81 | 72 | 319 | 82 | 59 |
|  | 13 | 220 | 82 | 15 | 195 | 144 | 236 | 2 | 204 |
|  | 23 | 122 | 115 | 115 | 138 | 0 | 85 | 135 | 161 |
|  | 59 | 0 | 0 | 0 | 0 | 0 | 0 | 0 | 0 |
| 38 | 0 | 167 | 185 | 151 | 123 | 190 | 164 | 91 | 121 |
|  | 9 | 151 | 177 | 179 | 90 | 0 | 196 | 64 | 90 |
|  | 10 | 157 | 289 | 64 | 73 | 0 | 209 | 198 | 26 |
|  | 12 | 163 | 214 | 181 | 10 | 0 | 246 | 100 | 140 |
|  | 60 | 0 | 0 | 0 | 0 | 0 | 0 | 0 | 0 |
| 39 | 1 | 173 | 258 | 102 | 12 | 153 | 236 | 4 | 115 |
|  | 3 | 139 | 93 | 77 | 77 | 0 | 264 | 28 | 188 |
|  | 7 | 149 | 346 | 192 | 49 | 165 | 37 | 109 | 168 |
|  | 19 | 0 | 297 | 208 | 114 | 117 | 272 | 188 | 52 |
|  | 61 | 0 | 0 | 0 | 0 | 0 | 0 | 0 | 0 |
| 40 | 0 | 157 | 175 | 32 | 67 | 216 | 304 | 10 | 4 |
|  | 8 | 137 | 37 | 80 | 45 | 144 | 237 | 84 | 103 |
|  | 17 | 149 | 312 | 197 | 96 | 2 | 135 | 12 | 30 |
|  | 62 | 0 | 0 | 0 | 0 | 0 | 0 | 0 | 0 |
| 41 | 1 | 167 | 52 | 154 | 23 | 0 | 123 | 2 | 53 |
|  | 3 | 173 | 314 | 47 | 215 | 0 | 77 | 75 | 189 |
|  | 9 | 139 | 139 | 124 | 60 | 0 | 25 | 142 | 215 |
|  | 18 | 151 | 288 | 207 | 167 | 183 | 272 | 128 | 24 |
|  | 63 | 0 | 0 | 0 | 0 | 0 | 0 | 0 | 0 |
| 42 | 0 | 149 | 113 | 226 | 114 | 27 | 288 | 163 | 222 |
|  | 4 | 157 | 14 | 65 | 91 | 0 | 83 | 10 | 170 |

TABLE 2-continued

|    |    |     |     |     |     |     |     |     |     |
|----|----|-----|-----|-----|-----|-----|-----|-----|-----|
|    | 24 | 137 | 218 | 126 |  78 |  35 |  17 | 162 |  71 |
|    | 64 |   0 |   0 |   0 |   0 |   0 |   0 |   0 |   0 |
| 43 |  1 | 151 | 113 | 228 | 206 |  52 | 210 |   1 |  22 |
|    | 16 | 163 | 132 |  69 |  22 | 243 |   3 | 163 | 127 |
|    | 18 | 173 | 114 | 176 | 134 |   0 |  53 |  99 |  49 |
|    | 25 | 139 | 168 | 102 | 161 | 270 | 167 |  98 | 125 |
|    | 65 |   0 |   0 |   0 |   0 |   0 |   0 |   0 |   0 |
| 44 |  0 | 139 |  80 | 234 |  84 |  18 |  79 |   4 | 191 |
|    |  7 | 157 |  78 | 227 |   4 |   0 | 244 |   6 | 211 |
|    |  9 | 163 | 163 | 259 |   9 |   0 | 293 | 142 | 187 |

TABLE 2-continued

|    |    |     |     |     |     |     |     |     |     |
|----|----|-----|-----|-----|-----|-----|-----|-----|-----|
|    | 22 | 173 | 274 | 260 |  12 |  57 | 272 |   3 | 148 |
|    | 66 |   0 |   0 |   0 |   0 |   0 |   0 |   0 |   0 |
| 45 |  1 | 149 | 135 | 101 | 184 | 168 |  82 | 181 | 177 |
|    |  6 | 151 | 149 | 228 | 121 |   0 |  67 |  45 | 114 |
|    | 10 | 167 |  15 | 126 |  29 | 144 | 235 | 153 |  93 |
|    | 67 |   0 |   0 |   0 |   0 |   0 |   0 |   0 |   0 |

Tables 1 and 2 are tables that are connected to each other in a vertical direction.

Tables 3 and 4 show basegraph 2 (BG2) defined in 3GPP TS 38.212.

TABLE 3

| $H_{BG}$ | | | | | | | | | $H_{BG}$ | | | | | | | | |
|---|---|---|---|---|---|---|---|---|---|---|---|---|---|---|---|---|---|
| Row index i | Column index j | $V_{i,j}$ Set index $i_{LS}$ | | | | | | | Row index i | Row index i | $V_{i,j}$ Column index j | | | | | | |
| | | 0 | 1 | 2 | 3 | 0 | 1 | 6 | 7 | 0 | 1 | 0 | 1 | 0 | 1 | 4 | 5 | 0 | 1 |

| i | j | 0 | 1 | 2 | 3 | 0 | 1 | 6 | 7 | i | i | 0 | 1 | 0 | 1 | 4 | 5 | 0 | 1 |
|---|---|---|---|---|---|---|---|---|---|---|---|---|---|---|---|---|---|---|---|
| 0 | 0 | 9 | 174 | 0 | 72 | 3 | 156 | 143 | 145 | 16 | 26 | 0 | 0 | 0 | 0 | 0 | 0 | 0 | 0 |
|  | 1 | 117 | 97 | 0 | 110 | 26 | 143 | 19 | 131 | 17 | 1 | 254 | 158 | 0 | 48 | 120 | 134 | 57 | 196 |
|  | 2 | 204 | 166 | 0 | 23 | 53 | 14 | 176 | 71 |  | 5 | 124 | 23 | 24 | 132 | 43 | 23 | 201 | 173 |
|  | 3 | 26 | 66 | 0 | 181 | 35 | 3 | 165 | 21 |  | 11 | 114 | 9 | 109 | 206 | 65 | 62 | 142 | 195 |
|  | 6 | 189 | 71 | 0 | 95 | 115 | 40 | 196 | 23 |  | 12 | 64 | 6 | 18 | 2 | 42 | 163 | 35 | 218 |
|  | 9 | 205 | 172 | 0 | 8 | 127 | 123 | 13 | 112 |  | 27 | 0 | 0 | 0 | 0 | 0 | 0 | 0 | 0 |
|  | 10 | 0 | 0 | 0 | 1 | 0 | 0 | 0 | 1 | 18 | 0 | 220 | 186 | 0 | 68 | 17 | 173 | 129 | 128 |
|  | 11 | 0 | 0 | 0 | 0 | 0 | 0 | 0 | 0 |  | 6 | 194 | 6 | 18 | 16 | 106 | 31 | 203 | 211 |
| 1 | 0 | 167 | 27 | 137 | 53 | 19 | 17 | 18 | 142 |  | 7 | 50 | 46 | 86 | 156 | 142 | 22 | 140 | 210 |
|  | 3 | 166 | 36 | 124 | 156 | 94 | 65 | 27 | 174 |  | 28 | 0 | 0 | 0 | 0 | 0 | 0 | 0 | 0 |
|  | 4 | 253 | 48 | 0 | 115 | 104 | 63 | 3 | 183 | 19 | 0 | 87 | 58 | 0 | 35 | 79 | 13 | 110 | 39 |
|  | 5 | 125 | 92 | 0 | 156 | 66 | 1 | 102 | 27 |  | 1 | 20 | 42 | 158 | 138 | 28 | 135 | 124 | 84 |
|  | 6 | 226 | 31 | 88 | 115 | 84 | 55 | 185 | 96 |  | 10 | 185 | 156 | 154 | 86 | 41 | 145 | 52 | 88 |
|  | 7 | 156 | 187 | 0 | 200 | 98 | 37 | 17 | 23 |  | 29 | 0 | 0 | 0 | 0 | 0 | 0 | 0 | 0 |
|  | 8 | 224 | 185 | 0 | 29 | 69 | 171 | 14 | 9 | 20 | 1 | 26 | 76 | 0 | 6 | 2 | 128 | 196 | 117 |
|  | 9 | 252 | 3 | 55 | 31 | 50 | 133 | 180 | 167 |  | 4 | 105 | 61 | 148 | 20 | 103 | 52 | 35 | 227 |
|  | 11 | 0 | 0 | 0 | 0 | 0 | 0 | 0 | 0 |  | 11 | 29 | 153 | 104 | 141 | 78 | 173 | 114 | 6 |
|  | 12 | 0 | 0 | 0 | 0 | 0 | 0 | 0 | 0 |  | 30 | 0 | 0 | 0 | 0 | 0 | 0 | 0 | 0 |
| 2 | 0 | 81 | 25 | 20 | 152 | 95 | 98 | 126 | 74 | 21 | 0 | 76 | 157 | 0 | 80 | 91 | 158 | 10 | 238 |
|  | 1 | 114 | 114 | 94 | 131 | 106 | 168 | 163 | 31 |  | 8 | 42 | 175 | 17 | 43 | 75 | 166 | 122 | 13 |
|  | 3 | 44 | 117 | 99 | 46 | 92 | 107 | 47 | 3 |  | 13 | 210 | 67 | 33 | 81 | 81 | 40 | 23 | 11 |
|  | 4 | 52 | 110 | 9 | 191 | 110 | 82 | 183 | 53 |  | 31 | 0 | 0 | 0 | 0 | 0 | 0 | 0 | 0 |
|  | 8 | 240 | 114 | 108 | 91 | 111 | 142 | 132 | 155 | 22 | 1 | 222 | 20 | 0 | 49 | 54 | 18 | 202 | 195 |
|  | 10 | 1 | 1 | 1 | 0 | 1 | 1 | 1 | 0 |  | 2 | 63 | 52 | 4 | 1 | 132 | 163 | 126 | 44 |
|  | 12 | 0 | 0 | 0 | 0 | 0 | 0 | 0 | 0 |  | 32 | 0 | 0 | 0 | 0 | 0 | 0 | 0 | 0 |
|  | 13 | 0 | 0 | 0 | 0 | 0 | 0 | 0 | 0 | 23 | 0 | 23 | 106 | 0 | 156 | 68 | 110 | 52 | 5 |
| 3 | 1 | 8 | 136 | 38 | 185 | 120 | 53 | 36 | 239 |  | 3 | 235 | 86 | 75 | 54 | 115 | 132 | 170 | 94 |
|  | 2 | 58 | 175 | 15 | 6 | 121 | 174 | 48 | 171 |  | 5 | 238 | 95 | 158 | 134 | 56 | 150 | 13 | 111 |
|  | 4 | 158 | 113 | 102 | 36 | 22 | 174 | 18 | 95 |  | 33 | 0 | 0 | 0 | 0 | 0 | 0 | 0 | 0 |
|  | 5 | 104 | 72 | 146 | 124 | 4 | 127 | 111 | 110 | 24 | 1 | 46 | 182 | 0 | 153 | 30 | 113 | 113 | 81 |
|  | 6 | 209 | 123 | 12 | 124 | 73 | 17 | 203 | 159 |  | 2 | 139 | 153 | 69 | 88 | 42 | 108 | 161 | 19 |
|  | 7 | 54 | 118 | 57 | 110 | 49 | 89 | 3 | 199 |  | 9 | 8 | 64 | 87 | 63 | 101 | 61 | 88 | 130 |
|  | 8 | 18 | 28 | 53 | 156 | 128 | 17 | 191 | 43 |  | 34 | 0 | 0 | 0 | 0 | 0 | 0 | 0 | 0 |
|  | 9 | 128 | 186 | 46 | 133 | 79 | 105 | 160 | 75 | 25 | 0 | 228 | 45 | 0 | 211 | 128 | 72 | 197 | 66 |
|  | 10 | 0 | 0 | 0 | 1 | 0 | 0 | 0 | 1 |  | 5 | 156 | 21 | 65 | 94 | 63 | 136 | 194 | 95 |
|  | 13 | 0 | 0 | 0 | 0 | 0 | 0 | 0 | 0 |  | 35 | 0 | 0 | 0 | 0 | 0 | 0 | 0 | 0 |
| 4 | 0 | 179 | 72 | 0 | 200 | 42 | 86 | 43 | 29 | 26 | 2 | 29 | 67 | 0 | 90 | 142 | 36 | 164 | 146 |
|  | 1 | 214 | 74 | 136 | 16 | 24 | 67 | 27 | 140 |  | 7 | 143 | 137 | 100 | 6 | 28 | 38 | 172 | 66 |
|  | 11 | 71 | 29 | 157 | 101 | 51 | 83 | 117 | 180 |  | 12 | 160 | 55 | 13 | 221 | 100 | 53 | 49 | 190 |
|  | 14 | 0 | 0 | 0 | 0 | 0 | 0 | 0 | 0 |  | 13 | 122 | 85 | 7 | 6 | 133 | 145 | 161 | 86 |
| 5 | 0 | 231 | 10 | 0 | 185 | 40 | 79 | 136 | 121 | 36 | 0 | 0 | 0 | 0 | 0 | 0 | 0 | 0 | 0 |
|  | 1 | 41 | 44 | 131 | 138 | 140 | 84 | 49 | 41 | 27 | 0 | 8 | 103 | 0 | 27 | 13 | 42 | 168 | 64 |
|  | 5 | 194 | 121 | 142 | 170 | 84 | 35 | 36 | 169 |  | 6 | 151 | 50 | 32 | 118 | 10 | 104 | 193 | 181 |
|  | 7 | 159 | 80 | 141 | 219 | 137 | 103 | 132 | 88 | 37 | 0 | 0 | 0 | 0 | 0 | 0 | 0 | 0 | 0 |
|  | 11 | 103 | 48 | 64 | 193 | 71 | 60 | 62 | 207 | 28 | 1 | 98 | 70 | 0 | 216 | 106 | 64 | 14 | 7 |
|  | 15 | 0 | 0 | 0 | 0 | 0 | 0 | 0 | 0 |  | 2 | 101 | 111 | 126 | 212 | 77 | 24 | 186 | 144 |
| 6 | 0 | 155 | 129 | 0 | 123 | 109 | 47 | 7 | 137 |  | 5 | 135 | 168 | 110 | 193 | 43 | 149 | 46 | 16 |
|  | 5 | 228 | 92 | 124 | 55 | 87 | 154 | 34 | 72 | 38 | 0 | 0 | 0 | 0 | 0 | 0 | 0 | 0 | 0 |
|  | 7 | 45 | 100 | 99 | 31 | 107 | 10 | 198 | 172 | 29 | 0 | 18 | 110 | 0 | 108 | 133 | 139 | 50 | 25 |
|  | 9 | 28 | 49 | 45 | 222 | 133 | 155 | 168 | 124 |  | 4 | 28 | 17 | 154 | 61 | 25 | 161 | 27 | 57 |
|  | 11 | 158 | 184 | 148 | 209 | 139 | 29 | 12 | 56 | 39 | 0 | 0 | 0 | 0 | 0 | 0 | 0 | 0 | 0 |
|  | 16 | 0 | 0 | 0 | 0 | 0 | 0 | 0 | 0 | 30 | 2 | 71 | 120 | 0 | 106 | 87 | 84 | 70 | 37 |
| 7 | 1 | 129 | 80 | 0 | 103 | 97 | 48 | 163 | 86 |  | 5 | 240 | 154 | 35 | 44 | 56 | 173 | 17 | 139 |
|  | 5 | 147 | 186 | 45 | 13 | 135 | 125 | 78 | 186 |  | 7 | 9 | 52 | 51 | 185 | 104 | 93 | 50 | 221 |
|  | 7 | 140 | 16 | 148 | 105 | 35 | 24 | 143 | 87 |  | 9 | 84 | 56 | 134 | 176 | 70 | 29 | 6 | 17 |

TABLE 3-continued

| | | H_BG | | | | | | | | | | H_BG | | | | | | | | |
|---|---|---|---|---|---|---|---|---|---|---|---|---|---|---|---|---|---|---|---|---|
| Row index | Column index | V_i,j Set index i_LS | | | | | | | | Row index i | Row index i | V_i,j Column index j | | | | | | | | |
| i | j | 0 | 1 | 2 | 3 | 0 | 1 | 6 | 7 | | | 0 | 1 | 0 | 1 | 4 | 5 | 0 | 1 |
| | 11 | 3 | 102 | 96 | 150 | 108 | 47 | 107 | 172 | | 40 | 0 | 0 | 0 | 0 | 0 | 0 | 0 | 0 |
| | 13 | 116 | 143 | 78 | 181 | 65 | 55 | 58 | 154 | 31 | 1 | 106 | 3 | 0 | 147 | 80 | 117 | 115 | 201 |
| | 17 | 0 | 0 | 0 | 0 | 0 | 0 | 0 | 0 | | 13 | 1 | 170 | 20 | 182 | 139 | 148 | 189 | 46 |
| 8 | 0 | 142 | 118 | 0 | 147 | 70 | 53 | 101 | 176 | | 41 | 0 | 0 | 0 | 0 | 0 | 0 | 0 | 0 |
| | 1 | 94 | 70 | 65 | 43 | 69 | 31 | 177 | 169 | 32 | 0 | 242 | 84 | 0 | 108 | 32 | 116 | 110 | 179 |
| | 12 | 230 | 152 | 87 | 152 | 88 | 161 | 22 | 225 | | 5 | 44 | 8 | 20 | 21 | 89 | 73 | 0 | 14 |
| | 18 | 0 | 0 | 0 | 0 | 0 | 0 | 0 | 0 | | 12 | 166 | 17 | 122 | 110 | 71 | 142 | 163 | 116 |
| 9 | 1 | 203 | 28 | 0 | 2 | 97 | 104 | 186 | 167 | | 42 | 0 | 0 | 0 | 0 | 0 | 0 | 0 | 0 |
| | 8 | 205 | 132 | 97 | 30 | 40 | 142 | 27 | 238 | 33 | 2 | 132 | 165 | 0 | 71 | 135 | 105 | 163 | 46 |
| | 10 | 61 | 185 | 51 | 184 | 24 | 99 | 205 | 48 | | 7 | 164 | 179 | 88 | 12 | 6 | 137 | 173 | 2 |
| | 11 | 247 | 178 | 85 | 83 | 49 | 64 | 81 | 68 | | 10 | 235 | 124 | 13 | 109 | 2 | 29 | 179 | 106 |
| | 19 | 0 | 0 | 0 | 0 | 0 | 0 | 0 | 0 | | 43 | 0 | 0 | 0 | 0 | 0 | 0 | 0 | 0 |
| 10 | 0 | 11 | 59 | 0 | 174 | 46 | 111 | 125 | 38 | 34 | 0 | 147 | 173 | 0 | 29 | 37 | 11 | 197 | 184 |
| | 1 | 185 | 104 | 17 | 150 | 41 | 25 | 60 | 217 | | 12 | 85 | 177 | 19 | 201 | 25 | 41 | 191 | 135 |
| | 6 | 0 | 22 | 156 | 8 | 101 | 174 | 177 | 208 | | 13 | 36 | 12 | 78 | 69 | 114 | 162 | 193 | 141 |
| | 7 | 117 | 52 | 20 | 56 | 96 | 23 | 51 | 232 | | 44 | 0 | 0 | 0 | 0 | 0 | 0 | 0 | 0 |
| | 20 | 0 | 0 | 0 | 0 | 0 | 0 | 0 | 0 | 35 | 1 | 57 | 77 | 0 | 91 | 60 | 126 | 157 | 85 |
| 11 | 0 | 11 | 32 | 0 | 99 | 28 | 91 | 39 | 178 | | 5 | 40 | 184 | 157 | 165 | 137 | 152 | 167 | 225 |
| | 7 | 236 | 92 | 7 | 138 | 30 | 175 | 29 | 214 | | 11 | 63 | 18 | 6 | 55 | 93 | 172 | 181 | 175 |
| | 9 | 210 | 174 | 4 | 110 | 116 | 24 | 35 | 168 | | 45 | 0 | 0 | 0 | 0 | 0 | 0 | 0 | 0 |
| | 13 | 56 | 154 | 2 | 99 | 64 | 141 | 8 | 51 | 36 | 0 | 140 | 25 | 0 | 1 | 121 | 73 | 197 | 178 |
| | 21 | 0 | 0 | 0 | 0 | 0 | 0 | 0 | 0 | | 2 | 38 | 151 | 63 | 175 | 129 | 154 | 167 | 112 |
| 12 | 1 | 63 | 39 | 0 | 46 | 33 | 122 | 18 | 124 | | 7 | 154 | 170 | 82 | 83 | 26 | 129 | 179 | 106 |
| | 3 | 111 | 93 | 113 | 217 | 122 | 11 | 155 | 122 | | 46 | 0 | 0 | 0 | 0 | 0 | 0 | 0 | 0 |
| | 11 | 14 | 11 | 48 | 109 | 131 | 4 | 49 | 72 | 37 | 10 | 219 | 37 | 0 | 40 | 97 | 167 | 181 | 154 |
| | 22 | 0 | 0 | 0 | 0 | 0 | 0 | 0 | 0 | | 13 | 151 | 31 | 144 | 12 | 56 | 38 | 193 | 114 |
| 13 | 0 | 83 | 49 | 0 | 37 | 76 | 29 | 32 | 48 | | 47 | 0 | 0 | 0 | 0 | 0 | 0 | 0 | 0 |
| | 1 | 2 | 125 | 112 | 113 | 37 | 91 | 53 | 57 | 38 | 1 | 31 | 84 | 0 | 37 | 1 | 112 | 157 | 42 |
| | 8 | 38 | 35 | 102 | 143 | 62 | 27 | 95 | 167 | | 5 | 66 | 151 | 93 | 97 | 70 | 7 | 173 | 41 |

TABLE 4

| | | | | | | | | | | | | | | | | | | | | |
|---|---|---|---|---|---|---|---|---|---|---|---|---|---|---|---|---|---|---|---|---|
| 13 | 13 | 222 | 166 | 26 | 140 | 47 | 127 | 186 | 219 | 38 | 11 | 38 | 190 | 19 | 46 | 1 | 19 | 191 | 105 |
| | 23 | 0 | 0 | 0 | 0 | 0 | 0 | 0 | 0 | | 48 | 0 | 0 | 0 | 0 | 0 | 0 | 0 | 0 |
| 14 | 1 | 115 | 19 | 0 | 36 | 143 | 11 | 91 | 82 | 39 | 0 | 239 | 93 | 0 | 106 | 119 | 109 | 181 | 167 |
| | 6 | 145 | 118 | 138 | 95 | 51 | 145 | 20 | 232 | | 7 | 172 | 132 | 24 | 181 | 32 | 6 | 157 | 45 |
| | 11 | 3 | 21 | 57 | 40 | 130 | 8 | 52 | 204 | | 12 | 34 | 57 | 138 | 154 | 142 | 105 | 173 | 189 |
| | 13 | 232 | 163 | 27 | 116 | 97 | 166 | 109 | 162 | | 49 | 0 | 0 | 0 | 0 | 0 | 0 | 0 | 0 |
| | 24 | 0 | 0 | 0 | 0 | 0 | 0 | 0 | 0 | 40 | 2 | 0 | 103 | 0 | 98 | 6 | 160 | 193 | 78 |
| 15 | 0 | 51 | 68 | 0 | 116 | 139 | 137 | 174 | 38 | | 10 | 75 | 107 | 36 | 35 | 73 | 156 | 163 | 67 |
| | 10 | 175 | 63 | 73 | 200 | 96 | 103 | 108 | 217 | | 13 | 120 | 163 | 143 | 36 | 102 | 82 | 179 | 180 |
| | 11 | 213 | 81 | 99 | 110 | 128 | 40 | 102 | 157 | | 50 | 0 | 0 | 0 | 0 | 0 | 0 | 0 | 0 |
| | 25 | 0 | 0 | 0 | 0 | 0 | 0 | 0 | 0 | 41 | 1 | 129 | 147 | 0 | 120 | 48 | 132 | 191 | 53 |
| 16 | 1 | 203 | 87 | 0 | 75 | 48 | 78 | 125 | 170 | | 5 | 229 | 7 | 2 | 101 | 47 | 6 | 197 | 215 |
| | 9 | 142 | 177 | 79 | 158 | 9 | 158 | 31 | 23 | | 11 | 118 | 60 | 55 | 81 | 19 | 8 | 167 | 230 |
| | 11 | 8 | 135 | 111 | 134 | 28 | 17 | 54 | 175 | | 51 | 0 | 0 | 0 | 0 | 0 | 0 | 0 | 0 |
| | 12 | 242 | 64 | 143 | 97 | 8 | 165 | 176 | 202 | | | | | | | | | | |

Tables 3 and 4 are tables that are coupled to each other in the vertical direction.

Coded bits (270) ($d_{r0}, \ldots, d_{r(Nr-1)}$) are generated by applying channel coding to the code blocks (265) ($c_{r0}, \ldots, c_{r(Kr-1)}$) (S215). The generated coded bits (270) may be rate-matched by shortening and puncturing. Alternatively, the coded bits (270) may be rate-matched by sub-block interleaving, bit selection, and/or interleaving. That is, the coded bits (270) ($d_{r0}, \ldots, d_{r(Nr-1)}$) are converted into rate-matched bits (275) ($f_{r0}, \ldots, f_{r(gr-1)}$) (S220). Typically, interleaving may refer to a process of changing the order of a bit sequence. Errors may be distributed by the interleaving. The interleaving is designed in consideration of efficient de-interleaving.

Sub-block interleaving may mean a process for dividing a code block into a plurality of sub-blocks (e.g., 32 sub-blocks) and allocating bits based on the sub-block interleaving.

The bit selection may mean a process for increasing a bit sequence by repeating bits based on the number of bits to be rate-matched or decreasing the bit sequence based on shortening, puncturing, etc. The interleaving may mean a process for interleaving encoded bits after the bit selection.

In another example of the present disclosure, the rate matching may include the bit selection and interleaving. The sub-block interleaving is not mandatory.

After interleaving the encoded bits, code block concatenation is applied to concatenate the code blocks (275) so that a codeword (285) ($g_0, \ldots, g_{G-1}$) may be generated (S225). The generated codeword (280) may be equivalent to one transport block (255).

Figure 3:
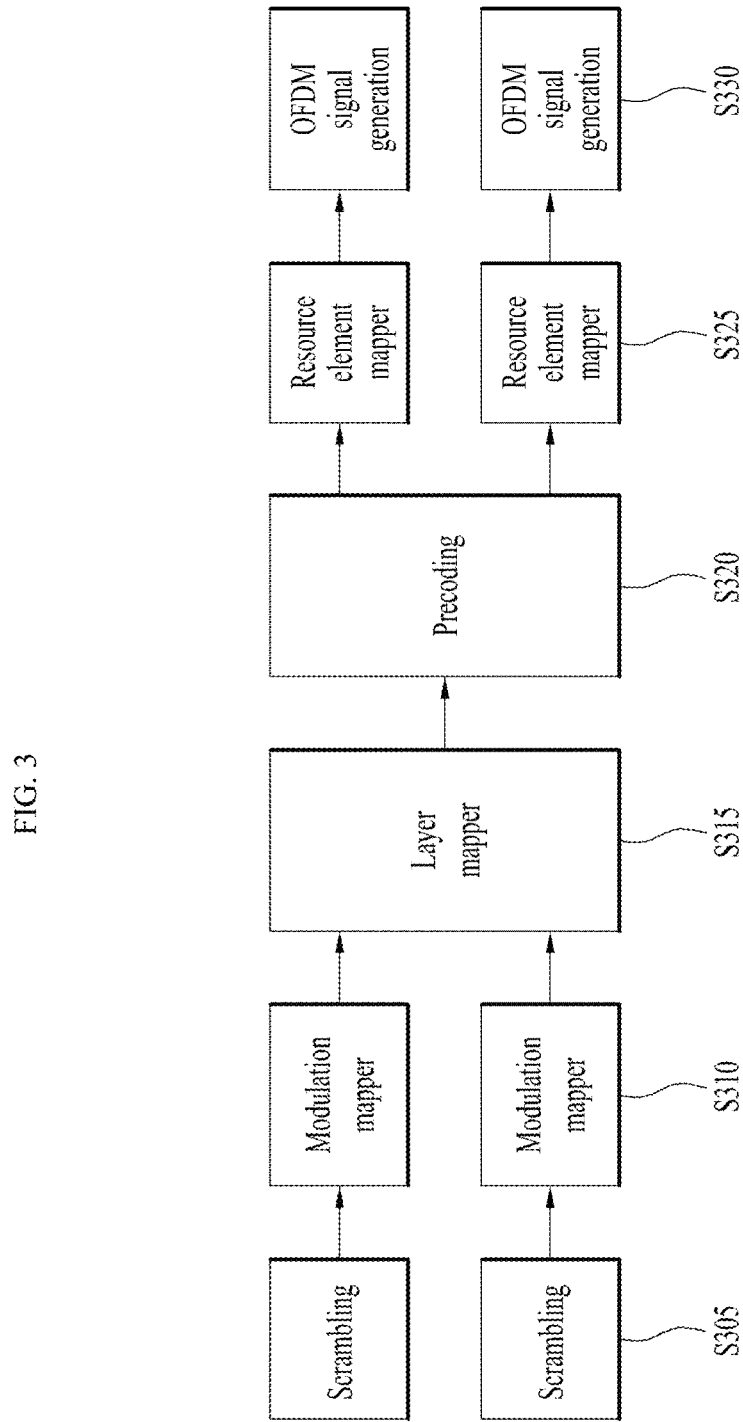
FIGS. 3 and 4 are diagrams for explaining a modulation method according to the present disclosure.
Figure 4:
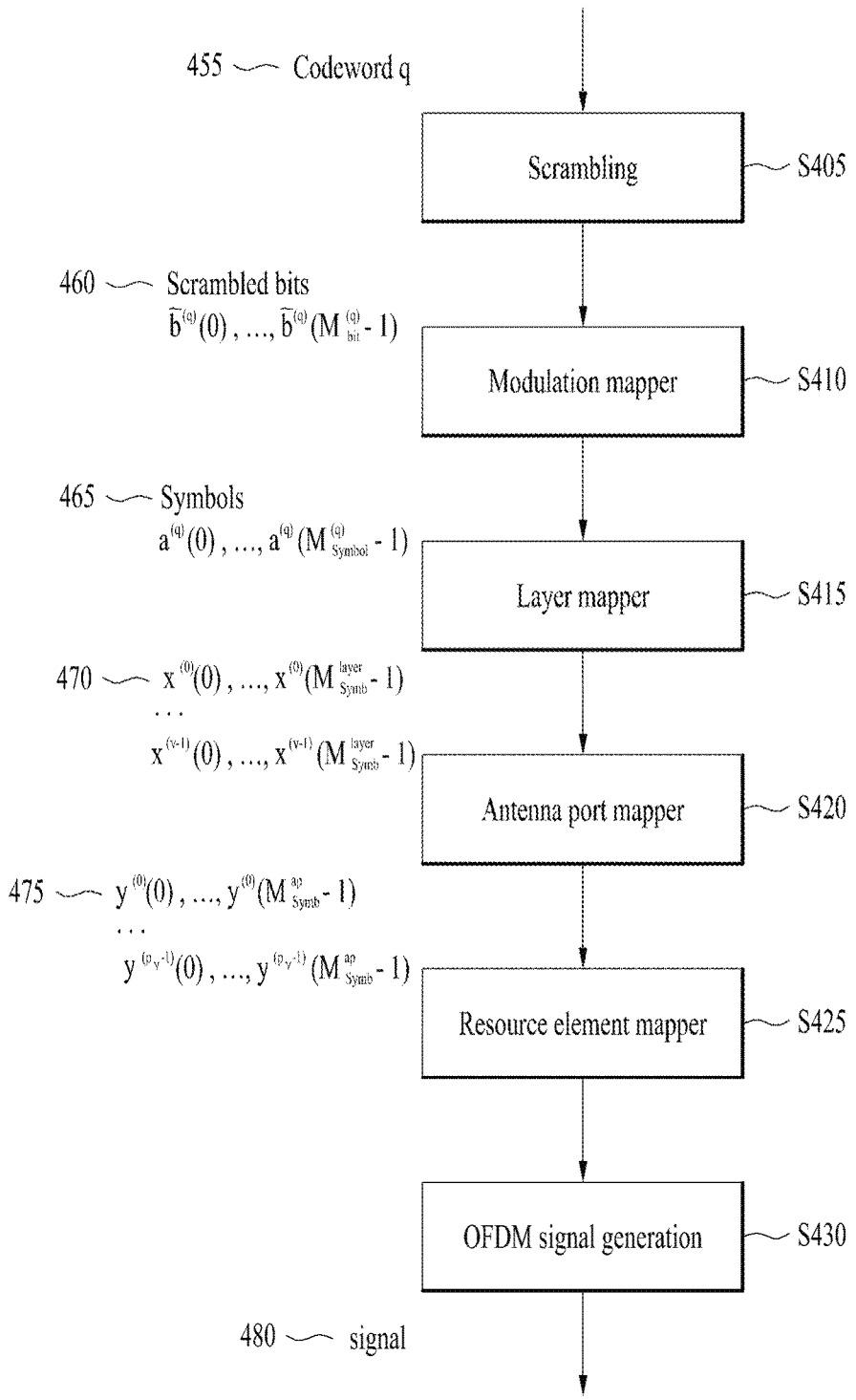

FIGS. 3 and 4 are diagrams for explaining a modulation method according to the present disclosure. One or more codewords are input and scrambled (S305 and S405). For example, scrambling may be performed based on EOR operation between an input bit sequence and a predetermined bit sequence. The scrambled bits are modulated (S310 and S410), and the modulated symbols are mapped to layers (S315 and S415). The symbols mapped to the layers are precoded for antenna port mapping. The precoded symbols are mapped to resource elements (S325 and S425). The mapped symbols are generated as OFDM signals (S330 and S430) and transmitted through antennas.

FIG. 5 is a diagram for explaining a protograph according to the present disclosure.

The protograph may be represented as a bipartite graph by displaying edges connecting variable nodes and check nodes to each other, or the features of the bipartite graph may be represented as a matrix.

Figures 5A, 5B:
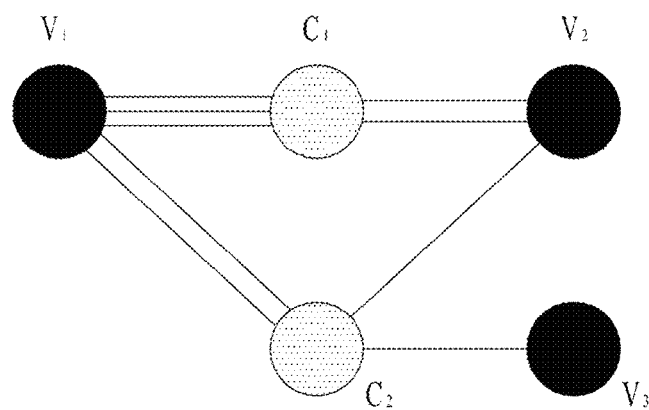
FIG. 5 is a diagram for explaining a protograph according to the present disclosure.

FIG. 5A shows an exemplary bipartite graph according to the present disclosure. V1, V2, and V3 denote variable nodes (VNs), and C1 and C2 denote check nodes (CNs).

The number of edges between V1 and C1 is 3.
The number of edges between V2 and C1 is 2.
The number of edges between V3 and C1 is 0.
The number of edges between V1 and C2 is 2.
The number of edges between V2 and C2 is 1.
The number of edges between V3 and C2 is 1.

FIG. 5B shows the matrix of the protograph. The matrix of the protograph may be referred to as a protomatrix. The matrix $H_p$ of the protograph may be obtained according to the numbers of edges between VNs and CNs. The first row and first column (1, 1) of $H_p$ means the number of edges between V1 and C1 (3). The second row and first column (2, 1) of $H_p$ means the number of edges between V1 and C2 (2). The first row and second column (1, 2) of $H_p$ means the number of edges between V2 and C1 (2). The second row and second column (2, 2) of $H_p$ means the number of edges between V2 and C2 (1). The first row and third column (1, 3) of $H_p$ means the number of edges between V3 and C1 (0). The second row and third column (2, 3) of $H_p$ means the number of edges between V3 and C2 (1).

FIG. 6 is a diagram for explaining a method of generating a parity check matrix according to the present disclosure.

FIG. 6 exemplarily shows a protograph, a base graph, and a parity check matrix. Specifically, FIG. 6A shows the protograph, FIG. 6B shows the base graph in which a lifting factor is considered (adjacent matrix), and FIG. 6C shows the parity check matrix.

The protograph shown in FIG. 6A is the same as the protomatrix $H_p$ of the protograph of FIG. 5B. A lifted matrix Ha may be obtained from the protomatrix $H_p$.

FIG. 6A shows an exemplary case in which the lifting factor is 3. The lifting factor may be appropriately selected according to the length of a codeword of LDCP coding.

Since the lifting factor (B) is 3, Z×Z matrices, each of which corresponds to each element of $H_p$, may be obtained. Since the (1, 1) element of Hp is 3, all elements of a Z×Z matrix corresponding to the (1, 1) element of Hp become 1. In addition, since the (1, 2) element of Hp is 2, the number of is included in each row of a Z×Z matrix corresponding to the (1, 2) element of Hp, needs to be 2, and the number of is included in each column thereof also needs to be 2. Further, since the (1, 3) element of Hp is 0, all elements of a Z×Z matrix corresponding to the (1, 3) element of Hp become 0. That is, the Z×Z matrix corresponding to the (1, 3) element of Hp becomes a zero matrix.

Since the (2, 1) element of Hp is 2, the number of is included in each row of a Z×Z matrix corresponding to the (1, 2) element of Hp needs to be 2, and the number of is included in each column thereof also needs to be 2. In addition, since the (2, 2) element of Hp is 1, the number of is included in each row of a Z×Z matrix corresponding to the (1, 2) element of Hp needs to be 1, and the number of is included in each column thereof also needs to be 1. Further, since the (1, 3) element of Hp is 2, the number of is included in each row of a Z×Z matrix corresponding to the (1, 3) element of Hp needs to be 2, and the number of Is included in each column thereof also needs to be 2.

The matrix Ha of FIG. 6B is an exemplary matrix written to correspond to the above description.

The matrix H of FIG. 6C represents a cyclically shifted matrix corresponding to the matrix Ha of FIG. 6B.

When $s_{i,j} \in \{0, \ldots, Z-1\}$, $s_{i,j}$ denotes a left-cyclic shift value of a Z×Z identity matrix. That is, when $s_{i,j}$ is −1, it may correspond to a Z×Z zero matrix. For example, when $s_{i,j}$ is 0, it may correspond to a Z×Z identity matrix. When $s_{i,j}$ is greater than 0, it may correspond to a matrix in which the Z×Z identity matrix is cyclically shifted to the left. That is, $s_{i,j}$ corresponds to a Z×Z matrix.

The lifted matrix Ha may be obtained from the protomatrix Hp corresponding to a bipartite graph, and the circulant shift parity check matrix (PCM) H may be obtained from the obtained lifted matrix Ha.

For LDPC coding according to the present disclosure, a PCM is required. For operation with the PCM, an information bit sequence and a parity bit sequence are used as input values. If the output value is a zero matrix, it is determined that the information bit sequence is correctly decoded.

Encoding may be defined as generating a parity bit sequence from an information bit sequence. The parity bit sequence may be generated from the information bit sequence by a generator matrix. The PCM for decoding the information bit sequence and the parity bit sequence may correspond to the generator matrix.

In addition, a parity bit sequence may be generated from an information bit sequence by the PCM without use of the generator matrix. For example, quasi-cyclic LDPC coding (QC-LDPC coding) may be used to generate a parity bit sequence from an information bit sequence based on the PCM.

For example, it is important to design a base graph of a PCM in QC-LDPC coding. QC-LDPC coding may generate a base graph from a protograph and derive a PCM from the generated base graph.

In general, the design of LDPC codes starts with a simple graph called a protograph. The protograph is composed of VNs, CNs, and edges, which may be expressed by $\Pi = (\bar{V}, \bar{C}, \bar{E})$, where $\bar{V}$ ($\bar{C}$) and $\bar{E}$ denote a set of VNs (CNs) and a set of edges included in the protograph Π.

The protograph is a minimum unit for representing a PCM of LDPC codes. Considering that performance prediction and encoding method are can be inferred by using a mathematical tool, designing good LDPC codes may be regarded equivalent to designing a good protograph.

The mathematical tool may be, for example, density evolution and extrinsic information transfer (EXIT) chart analysis.

For example, when designing a PCM, there are issues such as minimizing a period or cycle. The above issues may be solved by designing a PCM from a well-designed protograph. In general, lifting from the protograph to the PCM may be performed in the following order: protograph→base graph (adjacent matrix)→PCM. Here, the base graph may be expressed in the form of a binary matrix. The binary matrix may refer to a matrix in which the values of all elements included in the matrix are 0 or 1. That is, the binary matrix may include no parallel edges. Since no parallel edges are included, the PCM design and LDPC encoding may be implemented in a simple way.

When the PCM is lifted from the protograph, elements of the base graph may be determined from VNs, CNs and edges of the protograph. The elements of the base graph may be specified by rows and columns of the base graph, and a element value of 1 may mean that an edge exists between a VN (corresponding to a column) and a CN (corresponding to a row).

Table 5 below shows decoder classes for LDPC codes.

TABLE 5

|  | Sophisticated soft-value | Simple soft-value |
| --- | --- | --- |
| Full-parallelism | Flooding sum-product algorithm | Flooding min-sum algorithm |
| Partial-parallelism | Layered sum-product algorithm | Layered min-sum algorithm |

An LDPC code decoder according to the present disclosure will be described. The types of LDPC code decoders are largely classified according to parallelism and handling soft-values. Table 5 shows the classes of LDPC code decoders.

A full parallelism algorithm is based on a flooding algorithm. If variable-to-check (V2C) messages (performed by column-wise operation) and check-to-variable (C2V) messages (performed by row-wise operation) are all updated while a decoder is running, it may mean that the column-wise operation and row-wise operation are performed at the same time.

A layered algorithm is a partial parallelism algorithm and partially updates V2C messages and C2V messages by configuring layers in column units. In the layered algorithm, a parallel process is allowed in layers, but only a serial process is allowed between layers. A flooding algorithm (full parallelism) and a layered algorithm have advantages and disadvantages. The layered algorithm is also called a layered decoding algorithm. Decoding used in the layered decoding algorithm may be referred to as layered decoding.

Table 6 below shows the advantages and disadvantages of the flooding algorithm and the layered algorithm.

TABLE 6

|  | Flooding alg. vs Layered alg. |
| --- | --- |
| Latency per each iteration | Flooding better than layered |
| Convergence speed (# of iterations) | Layered better than Flooding |
| Hardware size | Layered better than Flooding |

In flooding decoding, C2V messages and V2C messages are updated alternately. However, since these messages are updated at a time (in one shot), the latency required to perform each iteration is relatively short. On the other hand, the convergence speed of the layered algorithm is generally about 2 times faster than that of the flooding algorithm. In addition, when the two algorithms are implemented in hardware, the layered algorithm is more efficient than the flooding algorithm in terms of size and memory. This is because the flooding algorithm has a relatively larger number of messages to be processed in one shot. FIGS. 7 to 10 are diagrams for explaining the flooding algorithm and the layered algorithm.

Figure 7A:
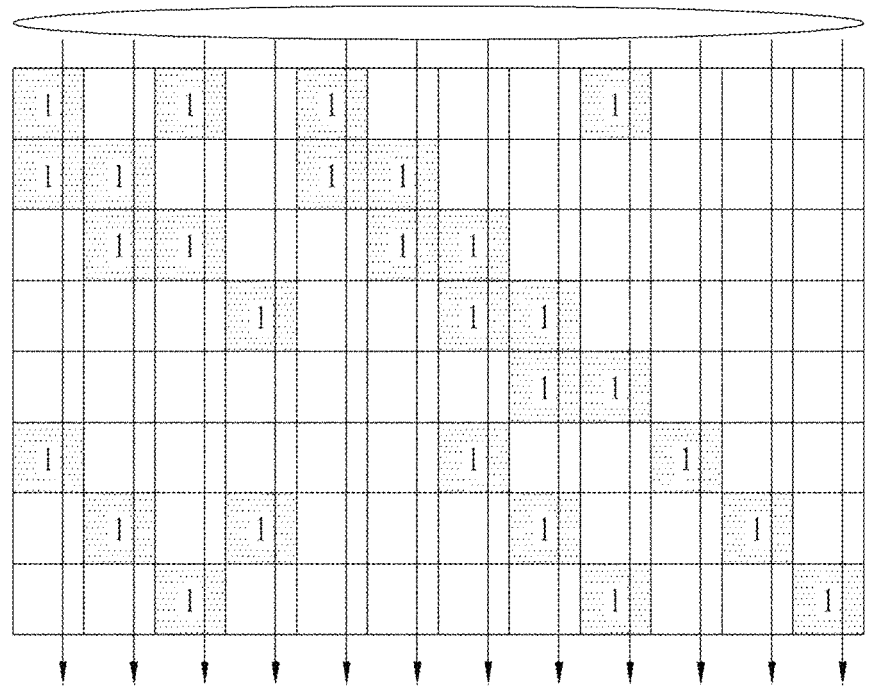
FIG. 7 is a diagram for explaining flooding decoding according to the present disclosure.
Figure 7B:
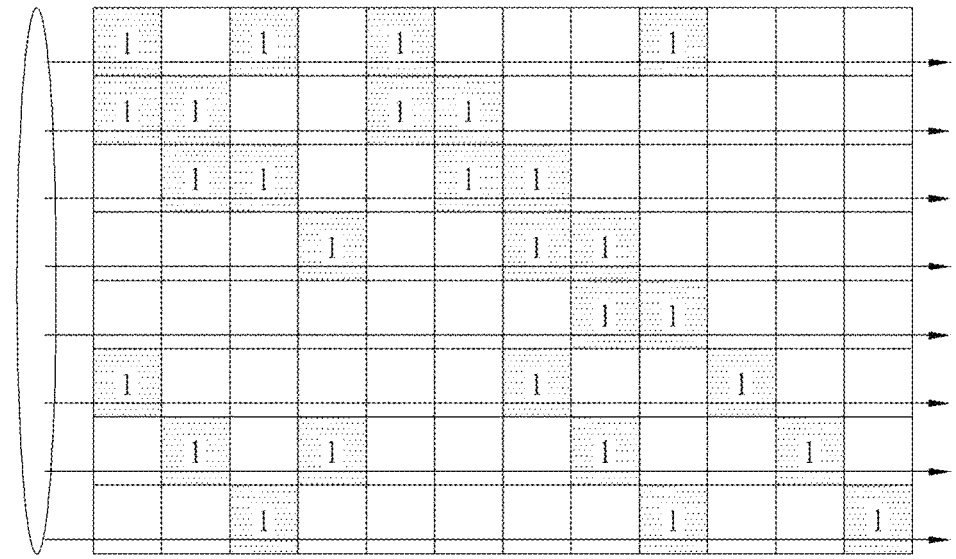

FIG. 7 is a diagram for explaining flooding decoding according to the present disclosure.

According to the flooding decoding algorithm, overall V2C messages are updated at the same time, and then overall C2C messages are updated at the same time. Since the flooding decoding algorithm has to process all V2C messages and all C2V messages at the same time, there is a disadvantage that the flooding decoding algorithm takes a long time to calculate.

On the other hand, the calculation of the layered decoding algorithm is somewhat complicated, but since V2C messages and C2V messages are updated for each layer, the layered decoding algorithm has a fast operation speed, compared to the flooding decoding algorithm. However, for the layered decoding algorithm, a problem of optimizing the number of iterations needs to be solved.

Figure 8A:
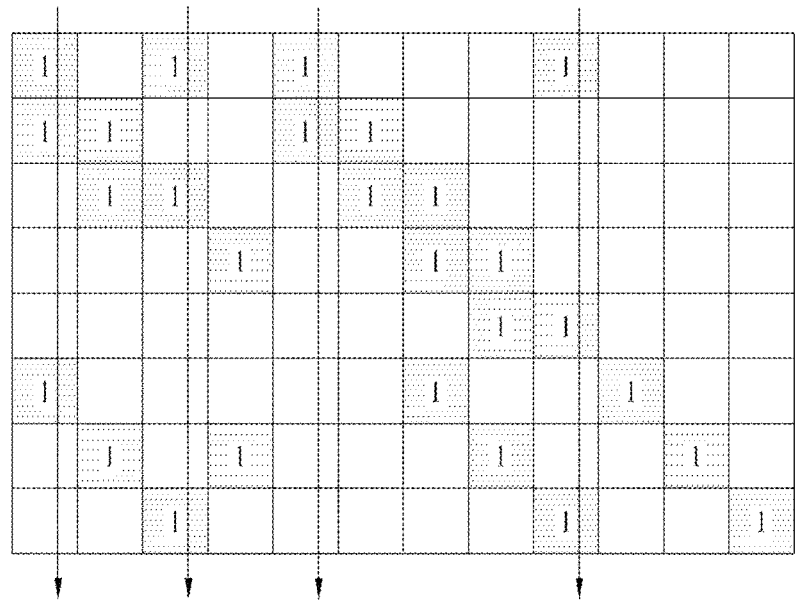
FIGS. 8 to 10 are diagrams for explaining layered decoding according to the present disclosure.
Figure 8B:
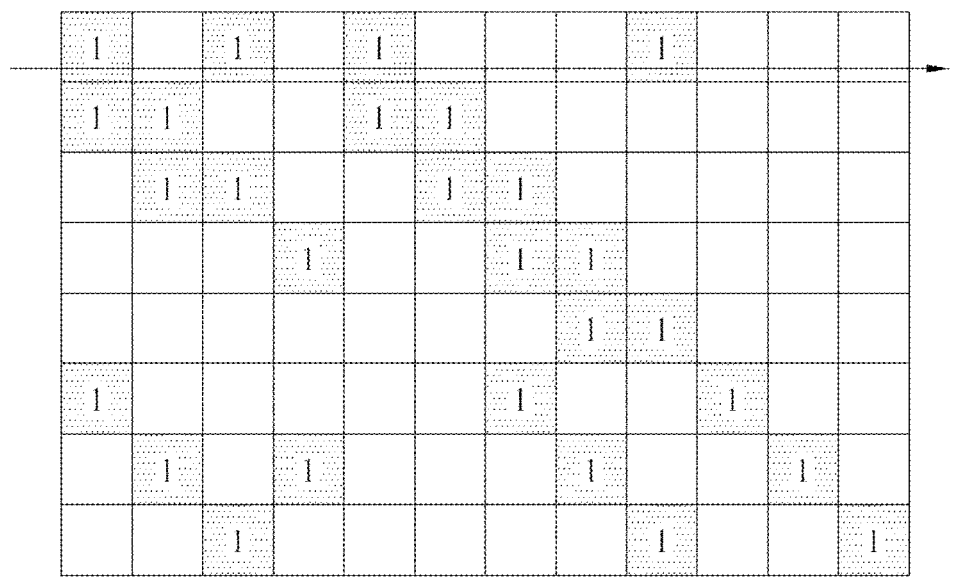
Figure 9A:
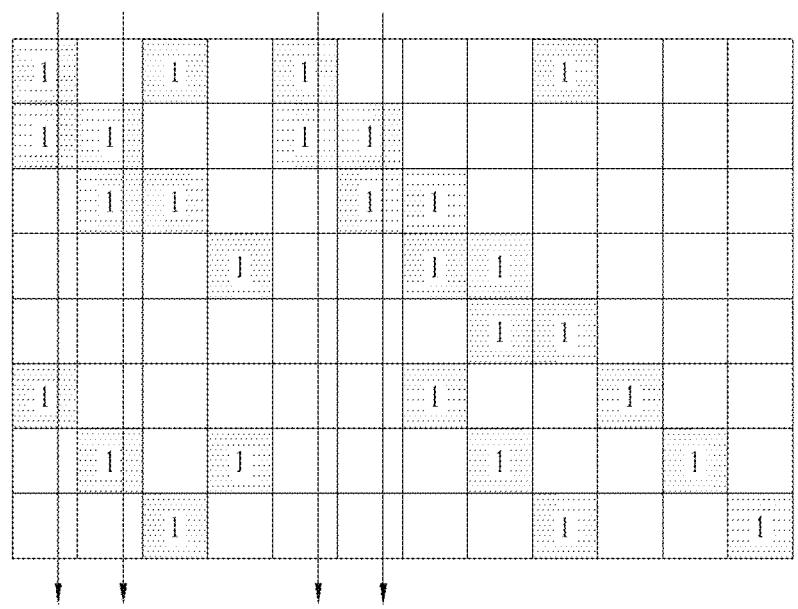
Figure 9B:
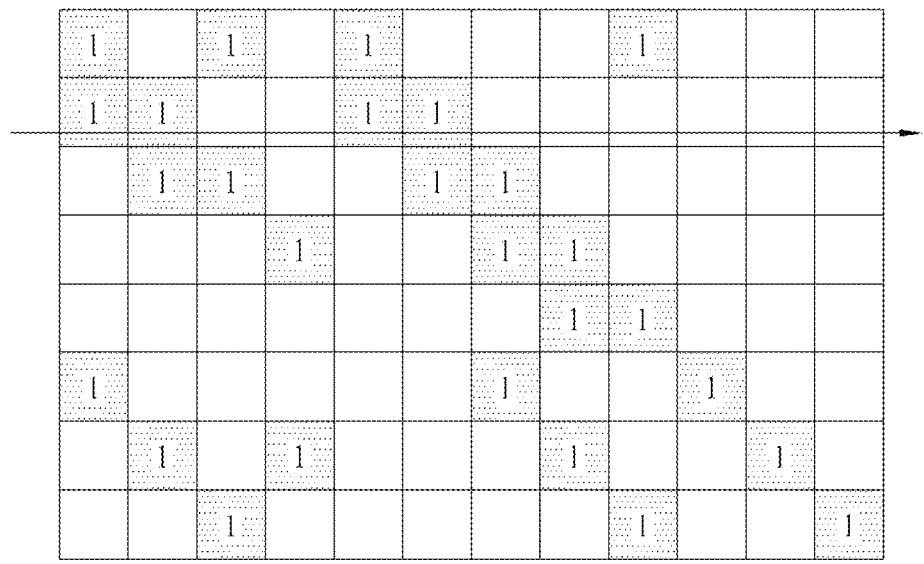
Figure 10A:
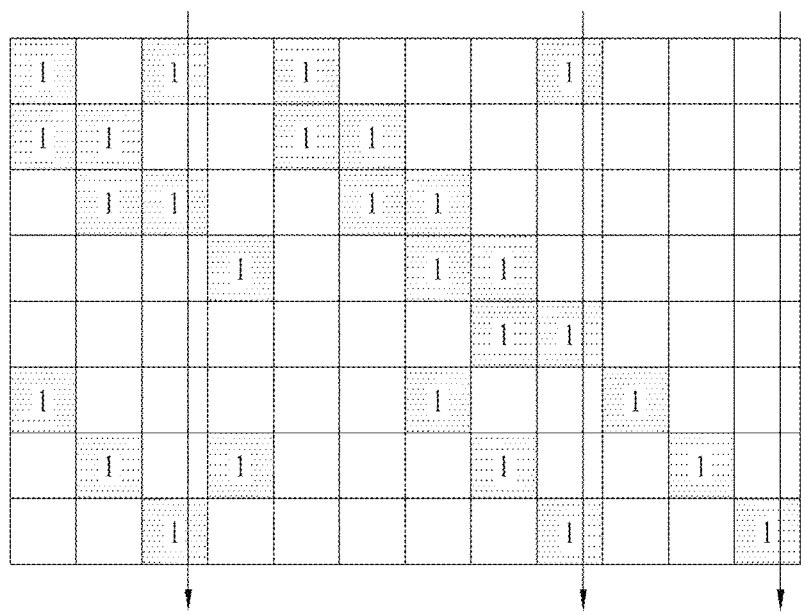
Figure 10B:
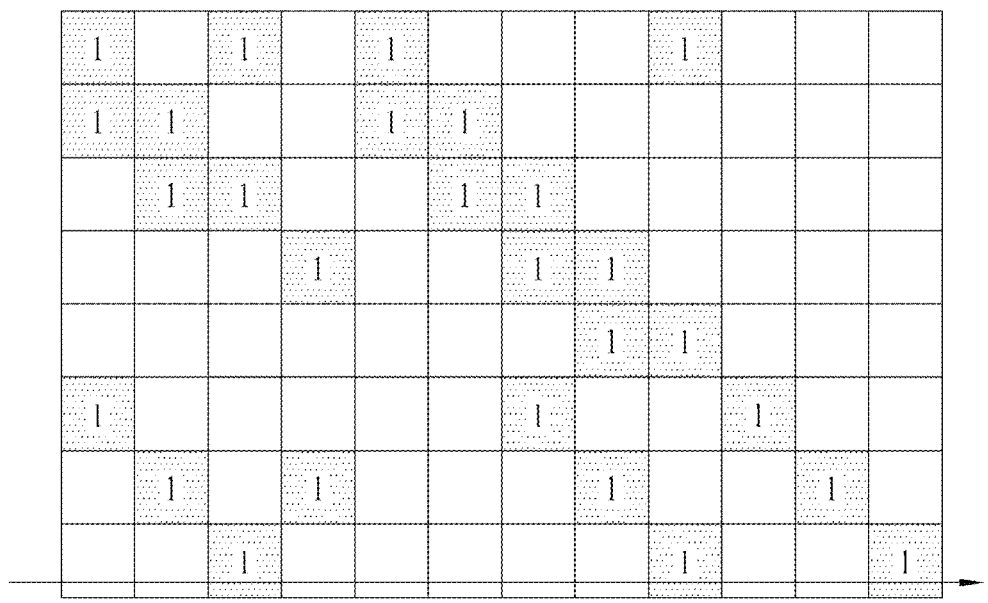

FIGS. 8 to 10 are diagrams for explaining layered decoding according to the present disclosure.

FIG. 8 is a diagram for explaining that V2C messages and C2V messages are updated in a first layer based on the layered decoding algorithm according to the present disclosure.

Based on the first layer, V2C messages having element values of 1 in the first row of all columns are updated. Also, based on the first layer, C2V messages having element values of 1 in the first column of all rows are updated.

FIG. 9 is a diagram for explaining that V2C messages and C2V messages are updated in a second layer based on the layered decoding algorithm according to the present disclosure.

Based on the second layer, V2C messages having element values of 1 in the second row of all columns are updated. Also, based on the second layer, C2V messages having element values of 1 in the second column of all rows are updated.

FIG. 10 is a diagram for explaining that V2C messages and C2V messages are updated in a last layer based on the layered decoding algorithm according to the present disclosure.

Based on the last layer, V2C messages having element values of 1 in the last row of all columns are updated. Also, based on the last layer, C2V messages having element values of 1 in the last column of all rows are updated.

The layered decoding algorithm is different from the flooding decoding algorithm in that V2C messages and C2V messages are updated for each layer. The calculation of the layered decoding algorithm may be complicated in that messages are hierarchically processed. However, since the layered decoding algorithm processes messages for each layer, the overall computational complexity of the layered decoding algorithm is lower than that of the flooding decoding algorithm.

However, to guarantee the performance of the layered decoding algorithm, layered decoding needs to be performed according to an appropriate number of iterations, which is a major consideration in designing a protograph and a base graph.

Due to the hardware implementation advantages described above, layered decoding algorithms are generally used in actual commercial products. In layered decoding, each layer may generally correspond to each row on a base graph. In an actual PCM, corresponding submatrices are circulant permutation matrices. The circulant permutation matrix is derived from each row of the base graph. The column weight of each column of the submatrix is maintained at most as 1. The fact that the weight of each column is maintained at most as 1 means that even if C2V messages generated from CNs corresponding to the rows of the submatrix are independently processed in parallel, it does not affect performance. That is, only one C2V message is generated in each VN.

Hereinafter, a method of designing a base graph by lifting from a protograph according to the present disclosure will be described.

The terms used in this document may be defined as follows.

Characters used in equations, etc. may be defined as follows. A regular character represents a scalar, a bold lowercase letter represents a vector, and a bold uppercase letter represents a matrix.

A blackboard bold character indicates a set. For example, $\alpha$, a, A and $\mathbb{A}$ denote a scalar, a vector, a matrix, and a set, respectively. In this case, $|\mathbb{A}|$ is the cardinality of the set $\mathbb{A}$, $|a|$ represents the length of the vector a, $\alpha_i$ (or $[a]_i$) denotes an i-th entry of the vector a, $\alpha_{i,j}$ (or $[A]_{i,j}$) denotes an entry located in an i-th row and a j-th column of the matrix A, and $[\mathbb{A}]_i$ denotes an i-th element of the set $\mathbb{A}$.

In addition, $A_{\mathbb{A},\mathbb{B}} = [\alpha_{i,j}]_{\{i \in \mathbb{A}, \mathbb{B}, j \in \mathbb{B}\}}$ denotes a submatrix having the elements of the set $\mathbb{A}$ as rows and having the elements of a set $\mathbb{B}$ as columns.

$\mathbb{Z}$ denotes a set of integer numbers, and $\mathbb{Z}^+$ denotes a set of natural numbers.

$d_v(i)$ denotes the weight (degree or weight) of an i-th VN.
$d_c(i)$ denotes the weight (degree or weight) of an i-th CN.
$d_v(i | \mathbb{C}')$ denotes the weight (degree) connected between the i-th VN and a set of CNs $\mathbb{C}'$.
$d_c(i | \mathbb{V}')$ denotes the weight (degree) connected between the i-th CN and a set of VNs $\mathbb{V}'$.
$d_{i,j}$ is the edge weight (degree) between the i-th CN and an j-th VN. $d_{i,j}$ may denote an entry on the i-th row and j-th column of a protomatrix.

$d_{max}(\mathbb{C})$ denotes the maximum weight (maximum degree) of VNs connected to CNs belonging to a set $\mathbb{C}$.

$d_{max}(\mathbb{V})$ represents the maximum weight (maximum degree) of CNs connected to VNs belonging to a set $\mathbb{V}$.

An indicator operation $\mathcal{I}(a, b)$ is defined by $\mathcal{I}(a, b) = 1$ if $\in \{\alpha_1\}_{i=1}^{|a|}$. Otherwise, indicator operation $\mathcal{I}(a, b)$ is defined by $\mathcal{I}(a, b) = 0$.

An operation $\sigma(a, i) = [\alpha_{i+1}, \ldots, \alpha_B, \alpha_1, \ldots, \alpha_i]$ refers to an operation of circularly shifting a vector $a(=[\alpha_i]_{i=1}^B)$ to the left by i.

$(.)^T$ means a transpose operator. The transpose operation refers to an operation that swaps rows and columns of a matrix. Equation 1 below is satisfied.

$$(A^T)_{j,i} = (A)_{i,j} \quad \text{[Equation 1]}$$

That is, the element on the j-th row and i-th column of the transpose of the matrix A is equal to the element on the i-th row and j-th column of the matrix A.

$(.)_N$ denotes a modulo-N operation.

Hereinafter, the method of designing a base graph by lifting from a protograph according to the present disclosure will be described.

A protograph $\Pi$ may be defined according to Equation 2 below.

$$\text{protograph } \Pi = (\mathbb{V}, \mathbb{C}, \mathbb{E}) \quad \text{[Equation 2]}$$

In Equation 2, $\mathbb{V}$ denotes a set of VNs, $\mathbb{C}$ denotes a set of CNs, and $\mathbb{E} = \{(i,j, d_{i,j}) | i \in \mathbb{C}, j \in \mathbb{V}, e \in \mathbb{Z}\}$ denotes a set of edges.

A protomatrix that expresses the protograph $\Pi$ in the form of a matrix may be represented by $\overline{H} = [d_{i,j}]\{i \in \mathbb{C}, j \in \mathbb{V}\}$. A base graph generated by lifting from the protomatrix may be denoted by H, where $\mathbb{C}$ denotes a set of lifted CNs, and $\mathbb{V}$ denotes a set of lifted VNs. When the lifting size is B, $\mathbb{C}$ and $\mathbb{V}$ may be determined according to Equation 3 below.

$$\mathbb{C} = \{B(l-1)+1, \ldots, Bl\} | l \in \mathbb{C}$$
$$\mathbb{V} = \{B(l-1)+1, \ldots, Bl\} | l \in \mathbb{V} \quad \text{[Equation 3]}$$

If a set of VNs on the base graph, which is derived from an l-th VN on the protograph, is defined as $\mathbb{V}^l$, $\mathbb{V}^l$ may be expressed by Equation 4.

$$\mathbb{V}^{[l]} = \{B(l-1)+1, \ldots, Bl\} \quad \text{[Equation 4]}$$

When the lifting size B satisfies a specific condition, a base graph capable of minimizing the number of layers may be designed based on a layered decoding algorithm. In this case, the maximum weight (maximum degree) ($d_{max}(\mathbb{C})$) on columns of the protomatrix may be the minimum number of layers. Here, the layer means a bundle of rows having a weight of at most 1.

$$B = b \cdot d_{max}(\mathbb{C}) \text{ for some } b \in \mathbb{Z}^+ \quad \text{Case 1}$$

When the lifting size is $B = b \cdot d_{max}(\mathbb{C})$ (where b is a natural number), a base graph capable of including $Q(= d_{max}(\mathbb{C}))$ layers may be designed based on an algorithm shown in Table 7 below. A matrix corresponding to the base graph may be generated based on Algorithm 1 described below.

TABLE 7

| Algorithm 1: Basegraph design method for Case 1 |
|---|
| Entries' Location Set Construction |

1: for $l = 1, \ldots, |\overline{\mathbb{V}}|$ do
2:    Generate $p_1^{[l]}$ as a randomly permuted vector of $[1, \ldots, B]$
3:    Construct a $d_v(l) \times B$ matrix $P^{[l]} = [(p_1^{[l]})^T, \ldots, (P_{d_v(l)}^{[l]})^T]^T$ where
      $p_i^{[l]} = [\sigma(p_{i-1}^{[l,2]}, 1), \ldots, \sigma(p_{i-1}^{[l,Q]}, 1), \sigma(p_{i-1}^{[l,1]}, 1)]$, $p_i^{[l]} = [p_i^{[l,1]}, \ldots, p_i^{[l,Q]}]$ and $p_i^{[l,q]} = [p_{i,b(q-1)+1}^{[l]}, \ldots, p_{i,bq}^{[l]}]$ 4:    Generate arbitrary partition set $\left\{\{\mathbb{P}^{[l,j]}\}_{j=1}^{|\mathbb{C}|} \Big| \bigcup_{j=1}^{|\mathbb{C}|} \mathbb{P}^{[l,j]} = \{1, \ldots, d_v(l)\}, \left|\mathbb{P}^{[l,j]}\right| = d_{j,l}\right\}$ 5:    for $q = 1, \ldots, Q$ do
6:       Construct the set of tuples of the entry locations (i.e., (row index, column index))$\mathbb{L}^{[l,q]}$ from $\mathbb{P}^{[l]}$ as
7:       $\mathbb{L}^{[l,q]} = \{(B(j-1) + b(q-1) + a, B(l-1) + c) | [p_i^{[l,q]}]_a = c, i \in \mathbb{P}^{[l,j]}, a = 1, \ldots, b \text{ and } i = 1, \ldots, d_v(l)\}$
8:    end
9: end TABLE 7-continued Algorithm 1: Basegraph design method for Case 1

Basegraph Construction

10:   for l = 1, . . . , |$\bar{v}$| do
11:     for q = 1, . . . , Q do
12:       [H]$_{l_1, l_2}$ = 1 for $\forall (l_1, l_2) \in L^{[l,q]}$
13:     end
14:   end A PCM may be derived from a protograph according to Algorithm 1 in Table 7. The PCM may be directly derived from the protograph according to the algorithm, but for convenience of understanding, it may be divided into a process of generating a base graph from a protograph and a process of generating a PCM from the generated base graph. When the base graph is generated from the protograph, the protograph may be lifted to the base graph based on a first lifting factor. In addition, when the PCM is generated from the generated base graph, the base graph may be lifted to the PCM based on a second lifting factor.

In the algorithm, Q may be a first lifting factor, and b may be a second lifting factor. The product of the first lifting factor and the second lifting factor may be referred to as a total lifting factor or simply a lifting factor. The total lifting factor may be B (=b*Q) on the algorithm.

First, a permuted vector may be randomly generated based on the first lifting factor Q in a column 1 of the protomatrix corresponding to the protograph. For example, if Q=4, the permuted vector $p_1^{[l]}$ may be [1 2 3 4]. There are a total of 24 (=4*3*2*1) types of permuted vectors, and the type may be randomly selected. For example, $p_1^{[l]}$ may be [3 2 1 4]. If the weight (or degree) ($d_v(l)$) of the column 1 is 2 or more, $p_2^{[l]}, \ldots, p_{d_v(l)}^{[l]}$ may be obtained sequentially based on $p_1^{[l]}$. For example, $p_2^{[l]}, \ldots, p_{d_v(l)}^{[l]}$ may be obtained from $p_1^{[l]}$ according to cyclic shifting. In this case, the acquisition of permuted vectors is not limited to cyclic shifting. However, a condition that the permuted vectors have different values in each column needs to be satisfied.

For example, when Q=4 and $d_v(l)$=4, if one permuted vector is $p_1^{[l]}$=[1 2 3 4], other permuted vectors may satisfy the following equations.

$p_1^{[l]}$=[1 2 3 4]$p_2^{[l]}$=[2 3 4 1]$p_3^{[l]}$=[3 4 1 2]$p_4^{[l]}$=[4 1 2 3]     [Equation 5]

$p_1^{[l]}$=[1 2 3 4]$p_2^{[l]}$=[2 1 4 3]$p_3^{[l]}$=[3 4 2 1]$p_4^{[l]}$=[4 3 1 2]     [Equation 6]

$p_1^{[l]}$=[1 2 3 4]$p_2^{[l]}$=[2 4 1 3]$p_3^{[l]}$=[3 1 4 2]$p_4^{[l]}$=[4 3 2 1]     [Equation 7]

If the condition that the permuted vectors have different values in each column is satisfied, more various combinations may be constructed by changing the order. A function a of Algorithm 1 is to configure various combinations that satisfy the condition that the permuted vectors have different values in each column. When permuted vectors have different values in each column, it is called decomposition characteristics of a matrix $P^{[l]}$ including the permuted vectors.

On the other hand, when a PCM for LDPC coding is generated, Q=$d_v(l)$ may be satisfied in few cases. That is, in most cases, Q>$d_v(l)$ may be satisfied. Due to low density of LDPC coding, $d_v(l)$=1 or $d_v(l)$=0 may be satisfied in many cases.

According to Algorithm 1, the matrix $P^{[l]}$ including the permuted vectors may be generated. For example, when Equation 5 is applied, $P^{[l]}$ may be determined by Equation 8 below.

$$P^{[l]} = \begin{bmatrix} 1 & 2 & 3 & 4 \\ 2 & 3 & 4 & 1 \\ 3 & 4 & 1 & 2 \\ 4 & 1 & 2 & 3 \end{bmatrix}$$     [Equation 8]

If Q<$d_v(l)$, permuted vectors corresponding to one element of the protomatrix may be less than or equal to the first lifting factor by distributing the permuted vectors for each row. If $d_v(l)$ permuted vectors correspond to one element of the protomatrix, Q≥$d_v(l)$ needs to be satisfied.

According to Algorithm 1, it is possible to determine a lifted matrix corresponding to one element of the protomatrix from $P^{[l]}$ based on a set $\mathbb{P}^{[i,j]}$, where l denotes a column of the protomatrix, and j denotes a row of the protomatrix. To distribute a permuted matrix corresponding to an element (j, l) of the protomatrix according to the number of edges related to an element (j, l) of the protomatrix from all rows of $P^{[l]}$, $\mathbb{P}^{[i,j]}$ may be determined. Each element of the set $\mathbb{P}^{[i,j]}$ may be one of $\{1, 2, \ldots, d_{v(l)}\}$.

For example, when $P^{[2]}$ satisfies Equation 8, if $\mathbb{P}^{[2, 1]}$={1, 4}, a permuted matrix corresponding to the element (1, 2) of the protomatrix may be $$\begin{bmatrix} 1 & 2 & 3 & 4 \\ 4 & 1 & 2 & 3 \end{bmatrix}$$

(which includes the first and fourth rows of $P^{[2]}$ based on $\mathbb{P}^{[2, 1]}$), and a matrix of a base graph corresponding to the element (1, 2) of the protomatrix may be $$\begin{bmatrix} 1 & 0 & 0 & 0 \\ 1 & 1 & 0 & 0 \\ 0 & 1 & 1 & 0 \\ 0 & 0 & 1 & 1 \end{bmatrix}.$$

The entire matrix of the base graph may be obtained by combining matrices corresponding to all elements (j, l) of the protomatrix.

When the entire matrix of the base graph is obtained, a PCM to be used for actual LDPC coding may be obtained by a cyclic shift operation. In this case, the PCM may be obtained from the base graph as described above with reference to FIG. 6C.

In Algorithm 1, each row may have the same weight (or degree). The base graph may be designed by using the same layered structure for each row of the prototype matrix.

Case 2: $\mathbb{C}$ May be Partitioned into Sets Shown in the Following Equations.

$$\left\{ \{\overline{\mathbb{C}}^{(g)}\}_{g=1}^{G} \Big| \sum_{g=1}^{G} d_{max}(\overline{\mathbb{C}}^{[g]}) = d_{max}(\overline{\mathbb{C}}), (B)_{d_{max}(\mathbb{C}[g])} = 0 \right\} \quad \text{[Equation 9]}$$

If the condition of Case 2 is satisfied, it is possible to design a base graph configurable with $Q_g(=d_{max}(\mathbb{C}^{[g]}))$ layers for each CN subset $\mathbb{C}^{[g]}$, which may be generated by the following algorithm. In this case, $\mathbb{C}^{[g]} = \{\mathbb{C}^{[g,q]} | q=1, \ldots, Q_g\}$, where $Q = \sum_{g=1}^{G} Q_g$.

TABLE 8

Algorithm 2: Basegraph design method for Case 2

Entries' Location Set Construction

1: for $l = 1, \ldots, |\overline{\mathbb{V}}|$ do
2:   for $g = 1, \ldots, G$ do
3:     Generate $p_1^{[l,g]}$ as a randomly permuted vector of $[1, \ldots, B]$ 3:     Construct a $d_v(l|\overline{\mathbb{C}}^{[g]}) \times B$ matrix $P^{[l,g]} = \left[ (p_1^{[l,g]})^T, \ldots, \left( p_{d_v(l|\overline{\mathbb{C}}^{[g]})}^{[l,g]} \right)^T \right]^T$ where $p_i^{[l,g]} = [\sigma(p_{i-1}^{[l,g,2]}, 1), \ldots, \sigma(p_{i-1}^{[l,g,Q_g]}, 1), \sigma(p_{i-1}^{[l,1]}, 1), p_i^{[l]} = [p_i^{[l,g,1]}, \ldots, p_i^{[l,g,Q_g]}]$
    and $P_i^{[l,g,q]} = [p_{i,b_g(q-1)+1}^{[l,g]}, \ldots, p_{i,b_g q}^{[l,g]}]$ and $b_g = B/Q_g$
4:     Generate arbitrary partition set $$\left\{ \{\mathbb{P}^{[l,g,j]}\}_{j=1}^{|\overline{\mathbb{C}}^{[g]}|} \Big| \bigcup_{j=1}^{|\overline{\mathbb{C}}^{[g]}|} |\mathbb{P}^{[l,g,j]}| = \{1, \ldots, d_v(l | \overline{\mathbb{C}}^{[g]})\}, |\mathbb{P}^{[l,g,j]}| = d_{[\overline{\mathbb{C}}^{[g]}]_{j,l}} \right\}$$

5:     for $q = 1, \ldots, Q$ do
6:       Construct the set of tuples of the entry locations (i.e., (row index, column index)) $\mathbb{L}^{[l,g,q]}$ from
7:       $P^{[l,g]}$ as
7:       $\mathbb{L}^{[l,g,q]} = \{(B([\overline{\mathbb{C}}^{[g]}]_j - 1) + b_g(q - 1) + a, B(l - 1) + c)|[p_i^{[l,g,q]}]_a = c, i \in \mathbb{P}^{[l,g,j]}, a = 1, \ldots, b_g$
8:       and $i = 1, \ldots, d_v(l|\overline{\mathbb{C}}^{[g]})\}$
9:     end
10:   end
11: end Basegraph Construction 12: for $l = 1, \ldots, |\overline{\mathbb{V}}|$ do
13:   for $g = 1, \ldots, G$ do
13:     for $q = 1, \ldots, Q_g$ do
14:       $[H]_{l_1, l_2} = 1$ for $\forall (l_1, l_2) \in \mathbb{L}^{[l,g,q]}$
14:     end
15:   end
16: end Based on Algorithm 1 and Algorithm 2, a base graph may be designed such that the minimum number of layers Q $(=d_{max}(\mathbb{C}))$ is satisfied for each of Case 1 and Case 2. This is because of the disjoint property of $P^{[l]}$ (or $P^{[l,g]}$). Here, the disjoint property may be defined as shown in Table 9 below.

TABLE 9 if $\tau(p_i^{[l,q]}, j) = 1$ for $\exists i \in \{1, \ldots, d_v(l)\}$ and $\exists j \in \{1, \ldots, B\}$,
then $\tau(p_{i'}^{[l,q]}, j) = 0$ for $\exists i' \in \{1, \ldots, d_v(l)\} \setminus \{i\}$ Referring to Table 9, it may be seen that there are no overlapping elements on each column of the matrix $P^{[l]}$. This implies that the column weight of a submatrix of a corresponding layer on the base graph is at most 1

In Algorithm 2, each row may have a different weight unlike Algorithm 1. In Algorithm 2, a base graph may be designed by using a different layered structure for each row of a protomatrix. The layered structure of Algorithm 2 is more complicated than that of Algorithm 1, so the design of the base graph also becomes complicated. However, if a protograph with a different layered structure for each row is used, a PCM with excellent performance may be designed.

According to the present disclosure, a plurality of base graphs may be generated by random selection from a given protograph. An optimal base graph may be selected from among the plurality of base graphs by testing the performance of the plurality of generated base graphs.

Algorithm 2 is performed in the same way as Algorithm 1, except for that the layered structure of Algorithm 2 is different from that of Algorithm 1. Unlike Algorithm 1 in which the same layered structure is applied to each row of the protomatrix, the layered structure varies for each row in algorithm 2 so that the base graph may be generated in the same way as Algorithm 1 but depending on the layered structure corresponding to each row.

The following embodiments are intended to help understanding of the above description.

Figure 11A:
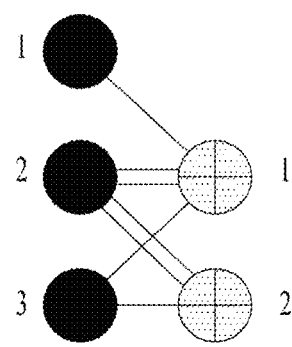
FIG. 11 illustrates an exemplary protograph and a base graph obtained based on Algorithm 1 and layered description.
Figure 11B:
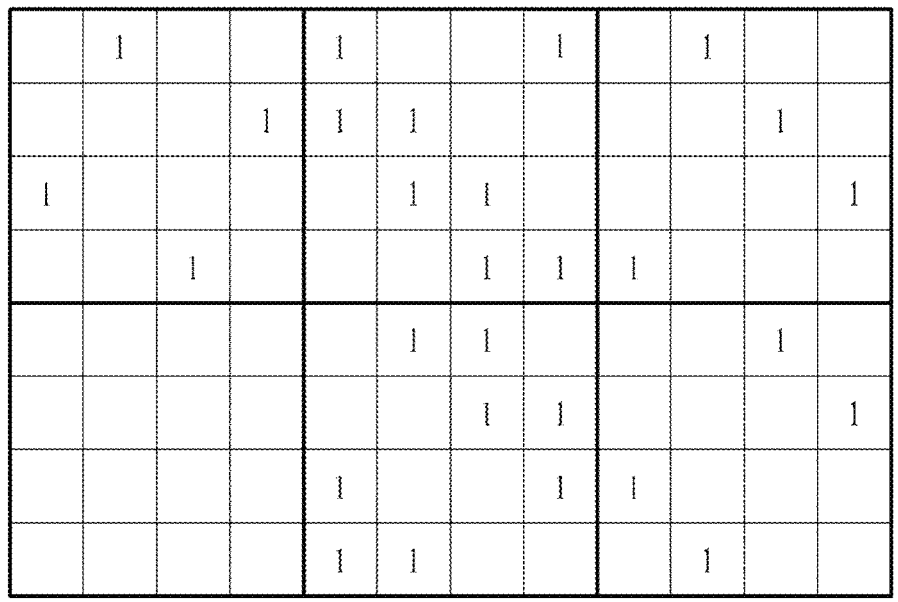
Figure 11C:
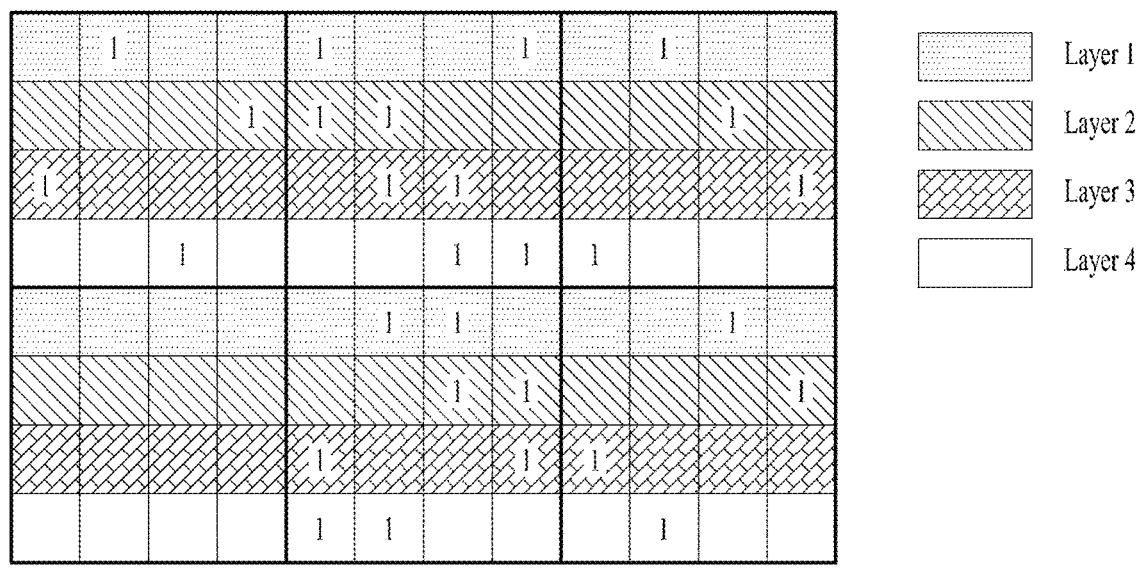

FIG. 11 illustrates an exemplary protograph and a base graph obtained based on Algorithm 1 and layered description.

Referring to FIG. 11, the base graph may be obtained by lifting the left protograph by B=4. If $\{P^{[l]}\}$ and $\{P^{[l,g]}\}$ are given as shown in Equation 10, Algorithm 1, which is the method for Case 1, may be used.

$$P^{[1]} = [2 \; 4 \; 1 \; 3], P^{[2]} = \begin{bmatrix} 1 & 2 & 3 & 4 \\ 2 & 3 & 4 & 1 \\ 3 & 4 & 1 & 2 \\ 4 & 1 & 2 & 3 \end{bmatrix}, \quad \text{[Equation 10]}$$

-continued $$P^{[3]} = \begin{bmatrix} 2 & 3 & 4 & 1 \\ 3 & 4 & 1 & 2 \end{bmatrix}, \text{and}$$

$$\mathbb{P}^{[2,1]} = \{1, 4\}, \mathbb{P}^{[2,2]} = \{2, 3\},$$

$$\mathbb{P}^{[1,1]} = \mathbb{P}^{[3,1]} = \{1\}, \mathbb{P}^{[3,2]} = \{2\}$$

Figures 12A, 12B:
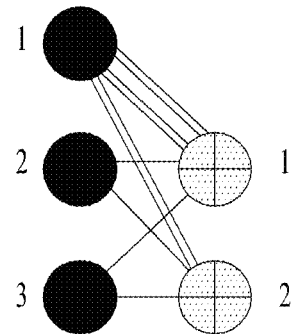
FIG. 12 illustrates an exemplary protograph and a base graph obtained based on Algorithm 2 and layered description.
Figure 12C:
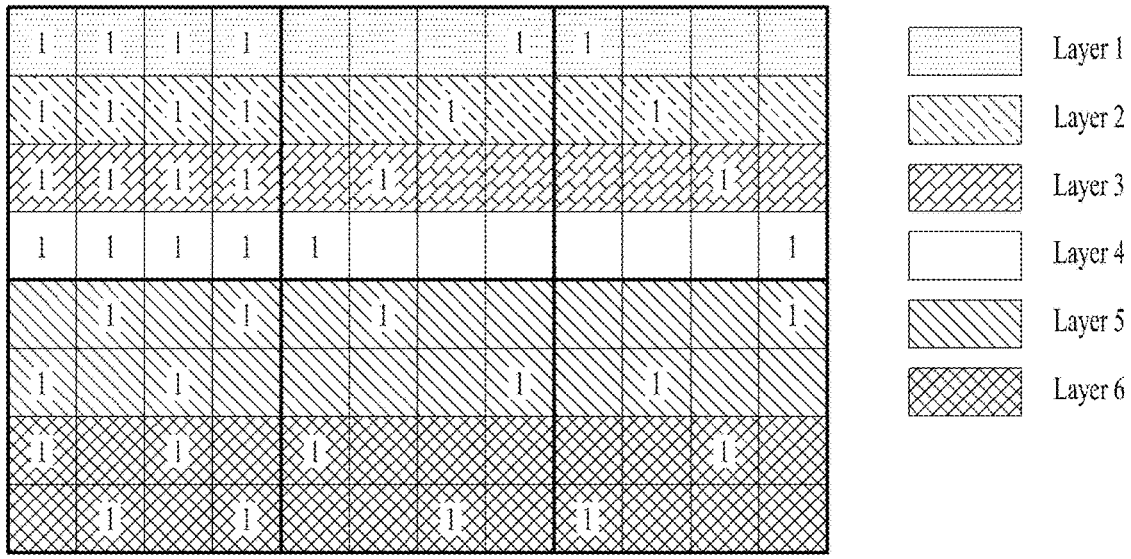

FIG. 12 illustrates an exemplary protograph and a base graph obtained based on Algorithm 2 and layered description.

Referring to FIG. 12, the base graph may be obtained by lifting the left protograph by B=4. If $P^{[l,g]}$ and $\mathbb{P}^{[l,g,j]}$ are given as shown in Equation 11, Algorithm 2, which is the method for Case 2, may be used.

$$P^{[1,1]} = \begin{bmatrix} 1 & 2 & 3 & 4 \\ 2 & 3 & 4 & 1 \\ 3 & 4 & 1 & 2 \\ 4 & 1 & 2 & 3 \end{bmatrix}, P^{[1,2]} = \begin{bmatrix} 2 & 3 & 1 & 4 \\ 4 & 1 & 3 & 2 \end{bmatrix},$$ [Equation 11]

$$P^{[2,1]} = [4 \ 3 \ 2 \ 1], P^{[1,2]} = [2 \ 4 \ 1 \ 3],$$

$$P^{[3,1]} = [1 \ 2 \ 3 \ 4], P^{[3,2]} = [4 \ 2 \ 3 \ 1], \text{and}$$

$$\mathbb{P}^{[1,1,1]} = \{1, 2, 3, 4\}, \mathbb{P}^{[1,2,1]} = \{1, 2\} \text{ and}$$

$$\mathbb{P}^{[2,1,1]} = \mathbb{P}^{[2,2,1]} = \mathbb{P}^{[3,1,1]} = \mathbb{P}^{[3,2,1]} = \{1\}$$

Figure 13:
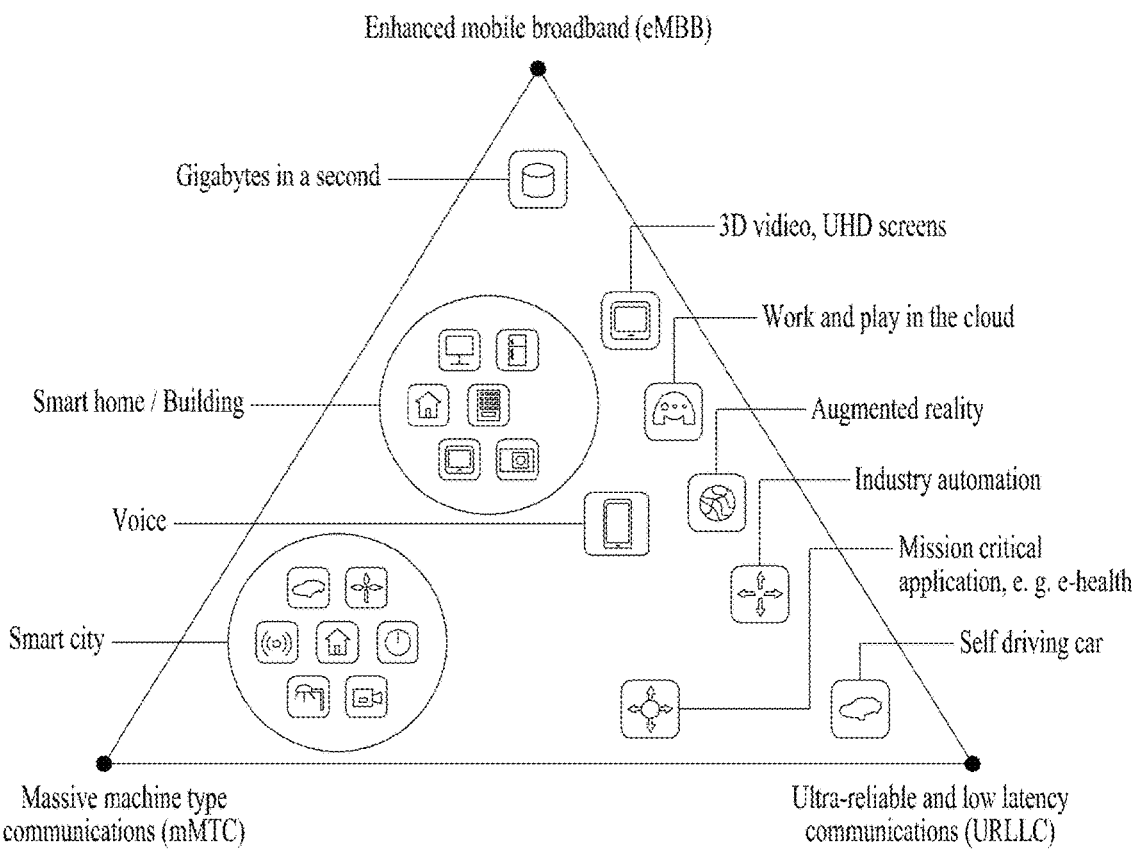
FIG. 13 illustrates an example of mapping fifth generation (5G) usage scenarios and various use cases according to the present disclosure.

FIG. 13 illustrates an example of mapping fifth generation (5G) usage scenarios and various use cases according to the present disclosure.

Referring to FIG. 13, three 5G usage scenarios may include: (1) enhanced mobile broadband (eMBB); (2) massive machine-type communications (mMTC); and (3) ultra-reliable and low-latency communications (URLLC).

Some use cases may require multiple use scenarios for optimization, and other use cases may focus on only one key performance indicator (KPI). 5G supports these various use cases in a flexible and reliable way.

The eMBB is related to human-centered communication. The eMBB goes far beyond basic mobile Internet access and covers rich interactive work, media and entertainment applications in the cloud or augmented reality. Data is one of the key drivers of 5G, and in the 5G era, we may for the first time see no dedicated voice service. In 5G, voice is expected to be handled as an application program, simply using data connectivity provided by communication systems. The main drivers for an increase in the traffic volume are an increase in the size of content and an increase in the number of applications requiring high data rates. Streaming services (audio and video), interactive video, and mobile Internet connectivity will continue to be used more broadly as more devices connect to the Internet. Many of these applications require always-on connectivity to push real time information and notifications to users. Cloud storage and applications are rapidly increasing for mobile communication platforms. This is applicable for both work and entertainment. Cloud storage is one particular use case driving the growth of uplink data rates. 5G will also be used for remote work in the cloud which, when done with tactile interfaces, requires much lower end-to-end latencies in order to maintain a good user experience. Entertainment, for example, cloud gaming and video streaming, is another key driver for the increasing need for mobile broadband capacity. Entertainment may be very essential on smart phones and tablets everywhere, including high mobility environments such as trains, vehicles and airplanes. Another use case is augmented reality (AR) for entertainment and information search, which requires very low latencies and significant instant data volumes.

One of the most anticipated 5G use cases is the ability to seamlessly connect embedded sensors in every field, that is, mMTC. The mMTC is pure machine-centric communications. It is expected that there will be 20.4 billion potential IoT devices by 2020. Industrial IoT is one area where 5G will play a major role in enabling smart cities, asset tracking, smart utilities, agriculture, and security infrastructure.

The URLLC encompasses human-centric and machine-centric communications. The URLLC has stringent requirements in terms of latency, reliability, and availability, for example, remote control of critical infrastructure and self-driving vehicles, autonomous vehicles, driverless cars, and robot cars. The URLLC includes new services that will change the industry through communication capable of satisfying the conditions of ultra-reliability/low latency/high availability. The URLLC is expected to play an important role in establishing the foundation for the fourth industrial revolution. The level of reliability and latency is essential for smart grid control, telemedicine surgery, industrial automation, robotics, and drone control and coordination. Due to the following characteristics: ultra-reliability, low latency, and high availability, the URLLC is also called critical MTC (C-MTC).

Next, a plurality of use cases in the triangle of FIG. 13 will be described in detail.

5G may complement fiber-to-the-home (FTTH) and cable-based broadband (or data-over-cable service interface specifications (DOCSIS)) to provide streams at a rate ranging from hundreds of megabits per second to gigabits per second. Such a high speed is required for TV broadcasts at or above a resolution of 4K (6K, 8K, and higher) as well as VR and AR. VR and AR applications mostly include immersive sport games. A special network configuration may be required for a specific application program. For VR games, for example, game companies may need to integrate core servers with edge network servers of network operators in order to minimize latency.

The automotive sector is expected to be a very important new driver for 5G, with many use cases for mobile communications for vehicles. For example, entertainment for passengers requires high capacity and high mobility mobile broadband at the same time because future users will expect to continue their good quality connections independent of their locations and speeds. Other use cases for the automotive sector are AR dashboards. These display overlay information at the top of what a driver is seeing through the front window, identifying objects in the dark and telling the driver about the distances and movements of the objects. In the future, wireless modules will enable communication between vehicles themselves, information exchange between vehicles and supporting infrastructure and between vehicles and other connected devices (e.g., those carried by pedestrians). Safety systems may guide drivers on alternative courses of action to allow the drivers to drive more safely and lower the risks of accidents. The next stage may be remote-controlled or self-driving vehicles. The emote-controlled or self-driving vehicles require very reliable and fast communication between different self-driving vehicles and between vehicles and infrastructure. In the future, self-driving vehicles will execute all driving activities, while drivers are focusing on traffic abnormality elusive to the vehicles themselves. The technical requirements for self-driving vehicles call for ultra-low latency and ultra-high reliability, increasing traffic safety to levels that humans are incapable of achieving.

Smart cities and smart homes, often referred to as smart society, will be embedded with dense wireless sensor networks. Distributed networks of intelligent sensors will identify conditions for cost efficient and energy efficient maintenance of the city or home. A similar setup may be done for each home, where temperature sensors, window and heating controllers, burglar alarms, and home appliances are all connected wirelessly. Many of these sensors are typically characterized by low data rates, low power, and low cost, but for example, real time high definition (HD) video may be required in some types of devices for surveillance.

The consumption and distribution of energy, including heat or gas, is becoming highly decentralized, creating the need for automated control of a very distributed sensor network. A smart grid interconnects such sensors based on digital information and communications technology to gather information and act based on the information. This information may include information about the behaviors of suppliers and consumers, allowing the smart grid to improve the efficiency, reliability, economics and sustainability of the production and distribution of fuels such as electricity in an automated fashion. The smart grid may be regarded as another sensor network with low delays.

The health sector has many applications that may benefit from mobile communications. Communications systems enable telemedicine, which provides clinical health care at a distance. It helps eliminate distance barriers and may improve access to medical services that would often not be consistently available in distant rural communities. It is also used to save lives in critical care and emergency situations. Wireless sensor networks based on mobile communication may provide remote monitoring and sensors for parameters such as heart rate and blood pressure.

Wireless and mobile communications are becoming increasingly important for industrial applications. Wires are expensive to install and maintain, and the possibility of replacing cables with reconfigurable wireless links is a tempting opportunity for many industries. However, the replacement requires that the wireless connection works with a similar delay, reliability and capacity as cables and that the management thereof also is simplified. Low delays and very low error probabilities are new requirements that need to be addressed with 5G.

Logistics and freight tracking are important use cases for mobile communications that enable the tracking of inventory and packages wherever they are, based on location-based information systems. The logistics and freight tracking use cases typically require lower data rates but need wide coverage and reliable location information.

According to the present disclosure, a transmitter configured to perform LDPC coding in a wireless communication system may be included in an autonomous driving device communicating with at least one of a mobile terminal, a BS, or an autonomous driving vehicle.

The transmitter may be configured to communicate with at least one of a mobile terminal, a BS, or an autonomous driving vehicle. The transmitter may be included in or mounted on an autonomous driving vehicle.

The transmitter may be configured to implement at least one function of advanced driver assistance systems (ADAS) based on a signal for controlling the movement of the autonomous driving vehicle.

The transmitter may be configured to switch the driving mode of the autonomous driving vehicle from an autonomous driving mode to a manual driving mode or from the manual driving mode to the autonomous driving mode based on user inputs.

The transmitter may be configured to generate an autonomous driving command based on external object information, and the autonomous driving vehicle may autonomously drive based on the autonomous driving command. The external object information may include at least one of a distance from the autonomous driving vehicle to an external object and a relative speed of the external object with respect to the autonomous driving vehicle.

A method of performing LDPC coding by a transmitter in a wireless communication system according to the present disclosure may include: obtaining a protomatrix related to a protograph; obtaining one or more permuted vectors related to each column of the protomatrix based on weights and lifting factors of columns of the protomatrix, wherein a first permuted vector included in the one or more permuted vectors is randomly generated; distributing the one or more permuted vectors for each row of a corresponding column; obtaining a plurality of lifted submatrices related to a plurality of elements of the protomatrix based on the distributed one or more permuted vectors; generating a base graph based on the plurality of lifted submatrices; generating a parity check matrix (PCM) based on the base graph; and performing the LDPC coding based on the PCM.

When the number of the one or more permuted vectors is more than or equal to 2, the remaining permuted vectors except for the first permuted vector may be obtained from the first permuted vector, and each of the one or more permuted vectors may have a different element at the same position.

The weights of the columns of the protomatrix may be determined based on edges of the protograph corresponding to the protomatrix.

The weights of the columns of the protomatrix may be equally distributed to rows of each column.

Based on the edges of the protograph, each of the weights of the columns of the protomatrix may be distributed differently to rows of a corresponding column.

The rows of the corresponding column may be divided into at least one layer, and each of the weights of the columns of the protomatrix may be distributed differently to the rows of the corresponding column to minimize the number of the at least one layer.

The method of performing the LDPC coding by the transmitter in the wireless communication system according to the present disclosure may further include: generating a plurality of PCMs based on randomly generated first permuted vectors; selecting one of the plurality of PCMs based on LDPC coding performance of the plurality of PCMs; and performing the LDPC coding based on the selected one PCM.

A transmitter configured to perform LDPC coding in a wireless communication system according to the present disclosure may include: a memory connected to a processor; and the processor. The processor is configured to: obtain one or more permuted vectors related to each column of the protomatrix based on weights and lifting factors of columns of the protomatrix, wherein a first permuted vector included in the one or more permuted vectors is randomly generated; distribute the one or more permuted vectors for each row of a corresponding column; obtain a plurality of lifted submatrices related to a plurality of elements of the protomatrix based on the distributed one or more permuted vectors; generate a base graph based on the plurality of lifted submatrices; generate a parity check matrix (PCM) based on the base graph; and perform the LDPC coding based on the PCM.

The above-described embodiments correspond to combinations of elements and features of the present disclosure in prescribed forms. And, the respective elements or features may be considered as selective unless they are explicitly mentioned. Each of the elements or features can be implemented in a form failing to be combined with other elements or features. Moreover, it is able to implement an embodiment of the present disclosure by combining elements and/or features together in part. A sequence of operations explained for each embodiment of the present disclosure can be modified. Some configurations or features of one embodiment can be included in another embodiment or can be substituted for corresponding configurations or features of another embodiment. And, it is apparently understandable that an embodiment is configured by combining claims failing to have relation of explicit citation in the appended claims together or can be included as new claims by amendment after filing an application. In addition, although each of the embodiments of the present disclosure may be implemented separately, but the embodiments may be implemented in combination.

Embodiments of the present disclosure are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

A method and device for transmitting the information block based on the LDPC code in a wireless communication system according to the present disclosure can be industrially applied to a variety of wireless communication systems such as 3GPP LTE/LTE-A/LTE-A PRO, a 5G system.

The invention claimed is:

1. A method of performing low density parity check (LDPC) coding by a transmitter in a wireless communication system, the method comprising:
   obtaining one or more permuted vectors corresponding to each column of a protomatrix based on weights and lifting factors of columns of the protomatrix, wherein a first permuted vector included in the one or more permuted vectors is randomly generated;
   distributing the one or more permuted vectors for each row of a corresponding column;
   obtaining a plurality of lifted submatrices corresponding to a plurality of elements of the protomatrix based on the distributed one or more permuted vectors;
   generating a base graph based on the plurality of lifted submatrices;
   generating a parity check matrix (PCM) based on the base graph;
   performing the LDPC coding on an information block based on the PCM to produce a coded bit sequence; and
   transmitting the coded bit sequence through a physical channel of the wireless communication system,
   wherein the information block includes an information bit sequence and a parity bit sequence generated from the information bit sequence,
   wherein the base graph is a matrix consisting of '0's and '1's, and
   wherein generating the PCM based on the base graph comprises:
   generating the PCM by (i) replacing each element of value 0 in the base graph by an Z-by-Z zero matrix and (ii) replacing each element of value 1 in the base graph by a circularly shifted Z-by-Z identity matrix.

2. The method of claim 1,
   wherein, based on a number of the one or more permuted vectors being greater than or equal to 2, remaining permuted vectors among the one or more permuted vectors other than the first permuted vector are obtained based on the first permuted vector, and
   wherein each of the one or more permuted vectors has a different element at a same position.

3. The method of claim 1,
   wherein the weights of the columns of the protomatrix are determined based on edges of a protograph corresponding to the protomatrix.

4. The method of claim 3,
   wherein the weights of the columns of the protomatrix are equally distributed to rows of each column of the protomatrix.

5. The method of claim 3,
   wherein, based on the edges of the protograph, each of the weights of the columns of the protomatrix is distributed differently to rows of a corresponding column.

6. The method of claim 5,
   wherein the rows of the corresponding column are divided into at least one layer, and wherein each of the weights of the columns of the protomatrix is distributed differently to the rows of the corresponding column to minimize a number of the at least one layer.

7. The method of claim 1, further comprising:
   generating a plurality of PCMs based on randomly generated first permuted vectors;
   selecting one PCM from among the plurality of PCMs based on LDPC coding performances of the plurality of PCMs; and
   performing the LDPC coding based on the selected one PCM.

8. A transmitter configured to perform low density parity check (LDPC) coding in a wireless communication system, the transmitter comprising:
   a transceiver;
   a processor; and
   a memory connected to the processor and storing at least one program that causes the processor to perform operations comprising:
   obtaining one or more permuted vectors corresponding to each column of a protomatrix based on weights and lifting factors of columns of the protomatrix, wherein a first permuted vector included in the one or more permuted vectors is randomly generated;
   distributing the one or more permuted vectors for each row of a corresponding column;
   obtaining a plurality of lifted submatrices corresponding to a plurality of elements of the protomatrix based on the distributed one or more permuted vectors;
   generating a base graph based on the plurality of lifted submatrices;
   generating a parity check matrix (PCM) based on the base graph;
   performing the LDPC coding on an information block based on the PCM to produce a coded bit sequence; and
   transmitting the coded bit sequence through a physical channel of the wireless communication system,
   wherein the information block includes an information bit sequence and a parity bit sequence generated from the information bit sequence,
   wherein the base graph is a matrix consisting of '0's and '1's, and wherein generating the PCM based on the base graph comprises:
  generating the PCM by (i) replacing each element of value 0 in the base graph by an Z-by-Z zero matrix and (ii) replacing each element of value 1 in the base graph by a circularly shifted Z-by-Z identity matrix.

9. The transmitter of claim 8,
wherein, based on a number of the one or more permuted vectors being greater than or equal to 2, remaining permuted vectors among the one or more permuted vectors other than the first permuted vector are obtained based on the first permuted vector, and
wherein each of the one or more permuted vectors has a different element at a same position.

10. The transmitter of claim 8,
wherein the weights of the columns of the protomatrix are determined based on edges of a protograph corresponding to the protomatrix.

11. The transmitter of claim 10,
wherein the weights of the columns of the protomatrix are equally distributed to rows of each column of the protomatrix.

12. The transmitter of claim 10,
wherein based on the edges of the protograph, each of the weights of the columns of the protomatrix is distributed differently to rows of a corresponding column.

13. The transmitter of claim 12,
wherein the rows of the corresponding column are divided into at least one layer, and wherein each of the weights of the columns of the protomatrix is distributed differently to the rows of the corresponding column to minimize a number of the at least one layer.

14. The transmitter of claim 8, wherein the operations further comprise:
  generating a plurality of PCMs based on randomly generated first permuted vectors;
  selecting one PCM from among the plurality of PCMs based on LDPC coding performances of the plurality of PCMs; and
  performing the LDPC coding based on the selected one PCM.

15. The transmitter of claim 8,
wherein the transmitter is included in an autonomous vehicle communicating with at least one of a mobile terminal, a base station, or an autonomous vehicle.

16. The method of claim 1, wherein the physical channel is a physical uplink shared channel (PUSCH).

17. The method of claim 1, wherein the physical channel is a physical downlink shared channel (PDSCH).

18. The transmitter of claim 8, wherein the physical channel is a physical uplink shared channel (PUSCH).

19. The transmitter of claim 8, wherein the physical channel is a physical downlink shared channel (PDSCH).

\* \* \* \* \*